United States Patent
Chen et al.

(10) Patent No.: US 10,854,726 B2
(45) Date of Patent: Dec. 1, 2020

(54) INTEGRATED CIRCUIT WITH DOPED LOW-K SIDEWALL SPACERS FOR GATE STACKS

(71) Applicant: Taiwan Semiconductor Manufacturing Co., Ltd., Hsinchu (TW)

(72) Inventors: Yen-Ting Chen, Hsinchu (TW); Wei-Yang Lee, Taipei (TW); Feng-Cheng Yang, Hsinchu County (TW); Yen-Ming Chen, Hsin-Chu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/678,472

(22) Filed: Nov. 8, 2019

(65) Prior Publication Data

US 2020/0075420 A1 Mar. 5, 2020

Related U.S. Application Data

(62) Division of application No. 15/813,742, filed on Nov. 15, 2017.

(51) Int. Cl.
*H01L 29/49* (2006.01)
*H01L 29/66* (2006.01)
(Continued)

(52) U.S. Cl.
CPC .... *H01L 29/4991* (2013.01); *H01L 21/76834* (2013.01); *H01L 21/823468* (2013.01);
(Continued)

(58) Field of Classification Search
CPC ............ H01L 29/41725; H01L 29/495; H01L 29/4991; H01L 29/6653; H01L 29/66545;
(Continued)

(56) References Cited

U.S. PATENT DOCUMENTS 6,348,385 B1   2/2002  Cha et al.
6,423,652 B1 * 7/2002  Chang ................... H01L 21/265
                                                    438/782
(Continued)

FOREIGN PATENT DOCUMENTS

CN    1700472 A   11/2005
CN    1917234 A    2/2007
(Continued)

OTHER PUBLICATIONS

Olawumi, Teju Tunde et al., "Modification of Ultra Low-k Dielectric Films by $O_2$ and $CO_2$ Plasmas," ECS Journal of Solid State Science and Technology, vol. 4, Issue 1, 2015, pp. N3048-N3057.
(Continued)

*Primary Examiner* — Michael Jung
(74) *Attorney, Agent, or Firm* — Haynes and Boone, LLP

(57) ABSTRACT

Various examples of an integrated circuit with a sidewall spacer and a technique for forming an integrated circuit with such a spacer are disclosed herein. In some examples, the method includes receiving a workpiece that includes a substrate and a gate stack disposed upon the substrate. A spacer is formed on a side surface of the gate stack that includes a spacer layer with a low-k dielectric material. A source/drain region is formed in the substrate; and a source/drain contact is formed coupled to the source/drain region such that the spacer layer of the spacer is disposed between the source/drain contact and the gate stack.

18 Claims, 16 Drawing Sheets

(51) Int. Cl.
*H01L 21/8238* (2006.01)
*H01L 21/8234* (2006.01)
*H01L 21/768* (2006.01)
*H01L 29/417* (2006.01)
*H01L 29/78* (2006.01)
*H01L 29/51* (2006.01)

(52) U.S. Cl.
CPC ........... *H01L 21/823475* (2013.01); *H01L 21/823864* (2013.01); *H01L 29/41725* (2013.01); *H01L 29/495* (2013.01); *H01L 29/6653* (2013.01); *H01L 29/6656* (2013.01); *H01L 29/66545* (2013.01); *H01L 29/66636* (2013.01); *H01L 29/66689* (2013.01); *H01L 29/78* (2013.01); *H01L 21/823425* (2013.01); *H01L 29/4966* (2013.01); *H01L 29/513* (2013.01); *H01L 29/517* (2013.01)

(58) Field of Classification Search
CPC ........... H01L 29/6656; H01L 29/66636; H01L 29/66689; H01L 29/78
See application file for complete search history.

(56) References Cited

U.S. PATENT DOCUMENTS

| | | | |
|---|---|---|---|
| 6,583,016 B1 | 6/2003 | Wei et al. | |
| 8,728,332 B2 | 5/2014 | Lin et al. | |
| 8,796,666 B1 | 8/2014 | Huang et al. | |
| 8,822,243 B2 | 9/2014 | Yan et al. | |
| 8,987,142 B2 | 3/2015 | Lee et al. | |
| 9,093,530 B2 | 4/2015 | Huang et al. | |
| 9,053,279 B2 | 6/2015 | Chang et al. | |
| 9,099,530 B2 | 8/2015 | Lin et al. | |
| 9,153,478 B2 | 10/2015 | Liu et al. | |
| 9,385,124 B1* | 7/2016 | Peng | H01L 21/823828 |
| 9,501,601 B2 | 11/2016 | Chang et al. | |
| 9,548,303 B2 | 1/2017 | Lee et al. | |
| 2005/0263834 A1 | 12/2005 | Chen et al. | |
| 2006/0220152 A1 | 10/2006 | Huang et al. | |
| 2007/0202640 A1 | 8/2007 | Al-Bayati et al. | |
| 2008/0258234 A1 | 10/2008 | Henson et al. | |
| 2011/0062502 A1 | 3/2011 | Yin et al. | |
| 2011/0215409 A1* | 9/2011 | Li | H01L 21/28088 257/351 |
| 2012/0126342 A1 | 5/2012 | Cheng et al. | |
| 2015/0115374 A1 | 4/2015 | Yin et al. | |
| 2015/0145073 A1 | 5/2015 | Lee et al. | |
| 2015/0162190 A1 | 6/2015 | Posseme | |
| 2015/0162445 A1 | 6/2015 | Wu et al. | |
| 2015/0228788 A1 | 8/2015 | Chen et al. | |
| 2016/0284820 A1* | 9/2016 | Basker | H01L 29/66553 |
| 2016/0365274 A1 | 12/2016 | Choi et al. | |
| 2017/0011967 A1 | 1/2017 | Yeo et al. | |
| 2017/0301692 A1 | 10/2017 | Batude et al. | |
| 2019/0148501 A1 | 5/2019 | Chen et al. | |

FOREIGN PATENT DOCUMENTS

| | | |
|---|---|---|
| JP | 2005333143 | 12/2005 |
| KR | 20170046093 | 4/2017 |
| TW | 201701402 | 1/2017 |
| TW | 201712740 | 4/2017 |
| TW | 1582998 B | 5/2017 |

OTHER PUBLICATIONS

Seo, Kohei et al., "New multi-step UV curing process for porogen-based porous SiOC," Interconnect Technology Conference (IITC 2009), IEEE International, Sapporo, Hokkaido, Japan, Jun. 1, 2009, pp. 101-103.

Yamashita, T. et al., "A Novel ALD SiBCN Low-k Spacer for Paracitic Capacitance Reduction in FinFETs," 2015 Symposium on VLSI Technology Digest of Technical Papers, IEEE, Kyoto, Japan, Jun. 16, 2015, 2 pages.

* cited by examiner

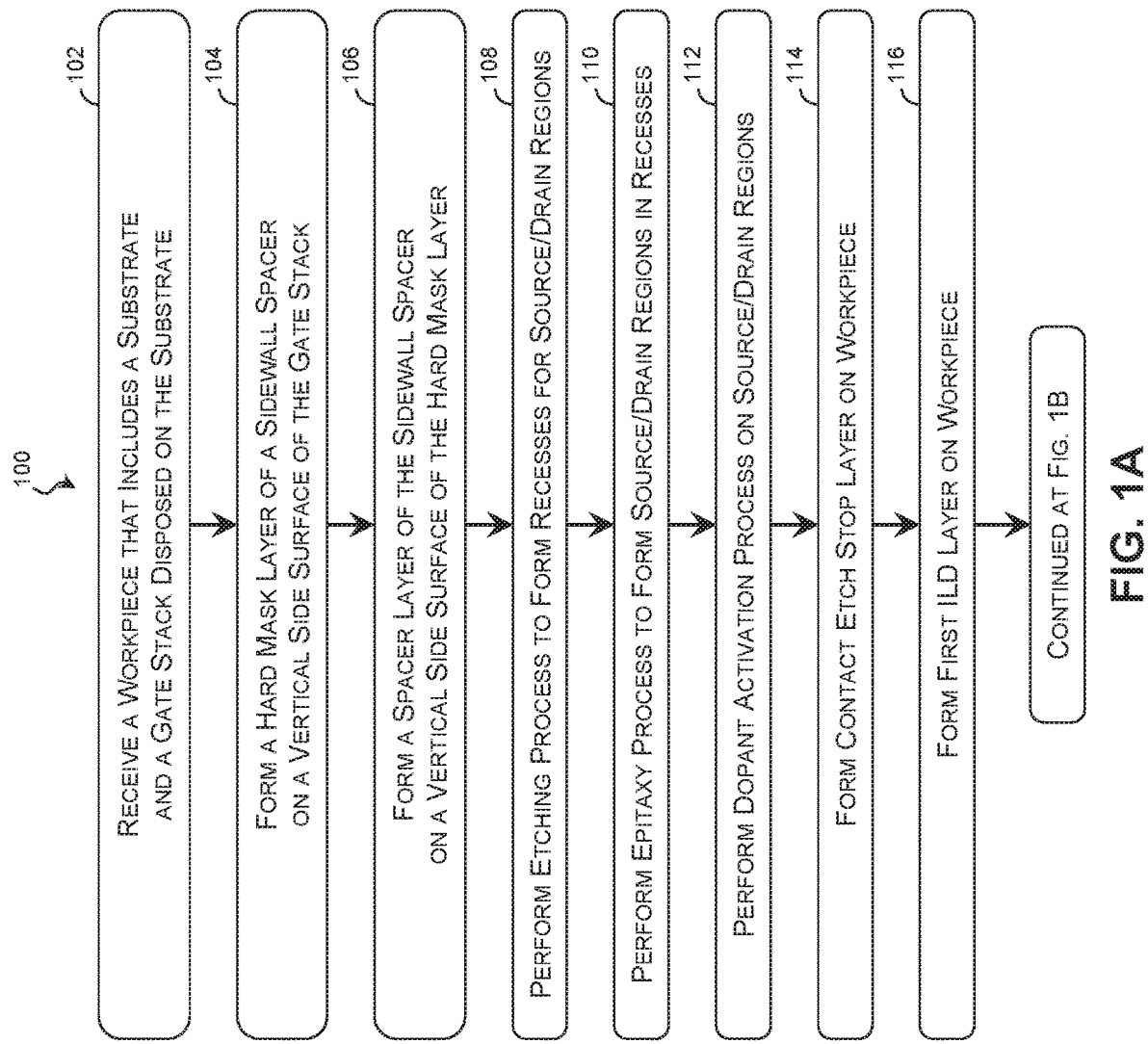

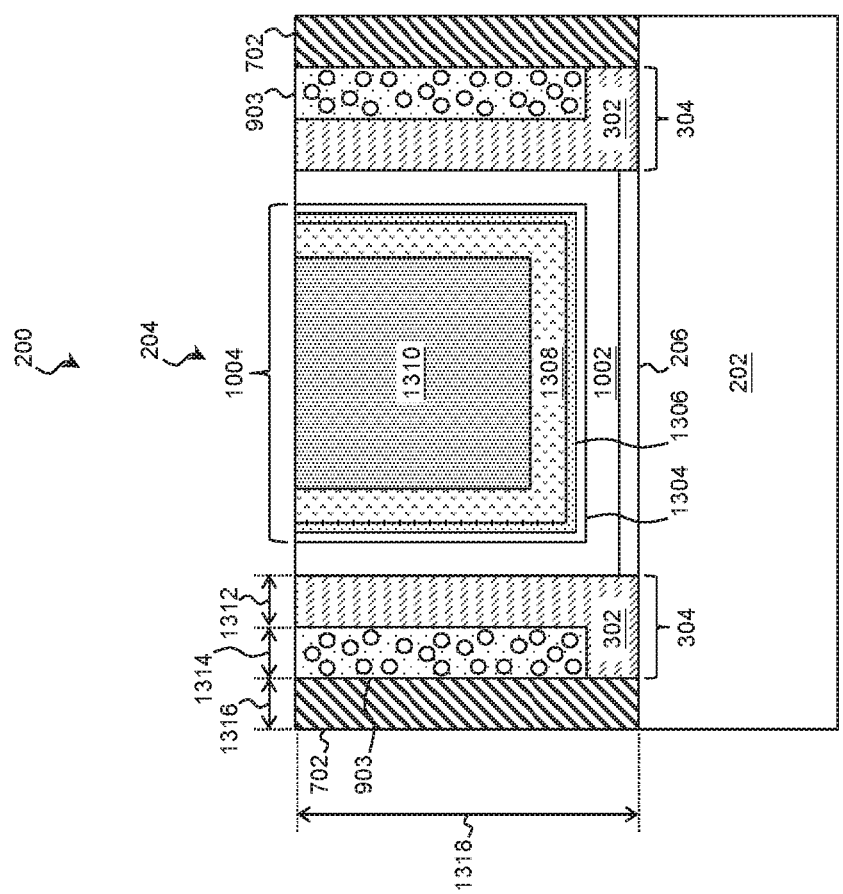

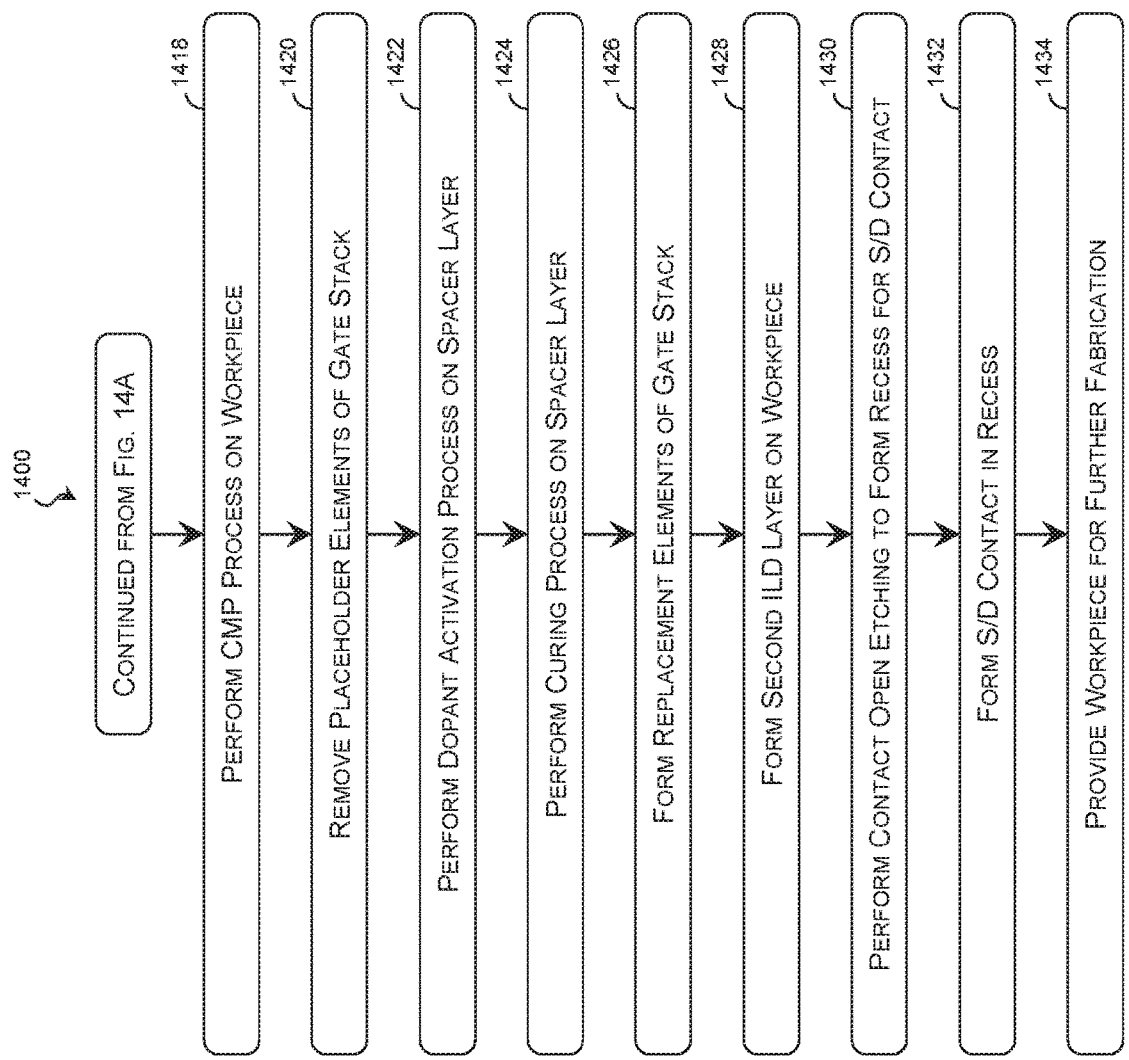

INTEGRATED CIRCUIT WITH DOPED LOW-K SIDEWALL SPACERS FOR GATE STACKS

PRIORITY DATA

The present application is a divisional application of U.S. application Ser. No. 15/813,742, filed Nov. 15, 2017, the disclosure of which is incorporated herein by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

For example, fabrication advances have reduced not only the size of the circuit features but the spacing between the features. However, even when such circuits can be fabricated, other issues may arise due to the reduced space between features. As merely one example, circuit features in close proximity may exhibit electrical effects on one another, such as capacitance and noise, which are exacerbated as the spacing is reduced. Low power devices may demonstrate increased sensitivity to such effects, which in turn, may limit minimum power and maximum performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B are flow diagrams of a method of forming an integrated circuit according to various aspects of the present disclosure.

FIGS. 14A and 14B are flow diagrams of a method of forming an integrated circuit with a doped spacer layer according to various aspects of the present disclosure.

DETAILED DESCRIPTION

Figure 1B:
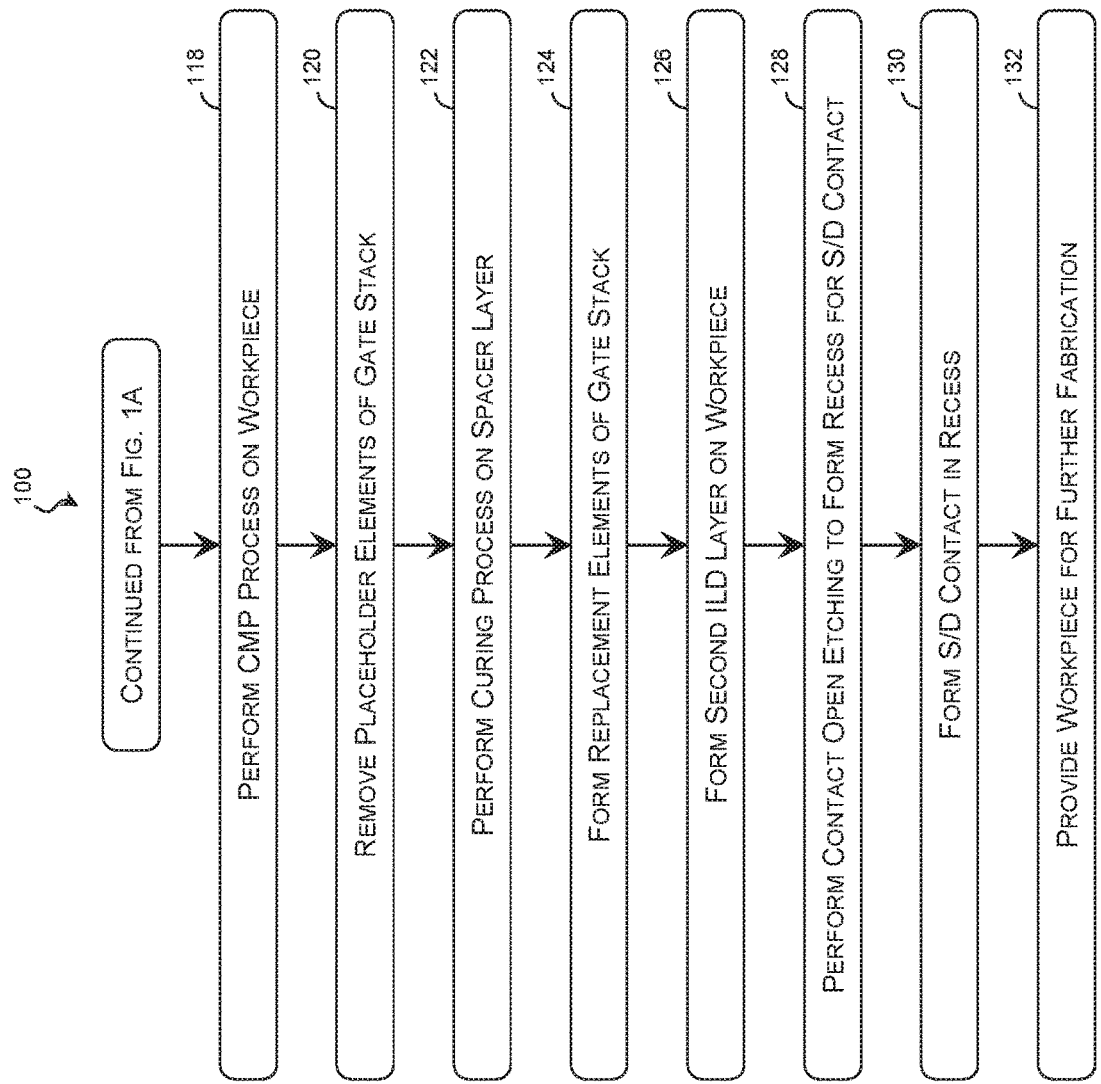

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

In the pursuit of smaller and more energy-efficient integrated circuits, features are being fabricated in closer proximity. As the spacing between features is reduced, adverse electrical effects, such as parasitic capacitance between the features, become more pronounced. Furthermore, individual devices may become more sensitive to these effects.

One example of parasitic capacitance occurs between a gate stack of a transistor (e.g., a CMOS transistor) and an adjacent source/drain contact. The capacitive coupling may delay the rise and fall of voltage at the gate and at the source/drain contact. Previously, the effect was small enough that this capacitance was considered negligible. However as device size shrinks, the distance between the gate and the source/drain contact is also reduced, which may increase the magnitude of the capacitance. Likewise, as the operational voltages of the transistor and other device are reduced, the sensitivity to parasitic capacitances increases. Accordingly, the previously negligible gate-contact capacitance may now decrease switching speed, increase switching power consumption, and increase coupling noise. In the interest of alleviating these effects, the present disclosure provides some examples of a device with reduced gate-contact capacitance and a technique for fabricating the device.

In some embodiments, the technique forms a sidewall spacer disposed between the gate stack and any source/drain contact. The sidewall spacer may have multiple layers, such as a dielectric hard mask layer disposed proximate to the gate stack and a spacer layer disposed on the dielectric hard mask layer. In some such examples, the sidewall dielectric includes a porous low-k dielectric material. The porous low-k dielectric material may be formed by depositing a low-k precursor and a porogen and subsequently curing the precursor during a gate-replacement process. Curing the precursor causes the porogen to create voids in the spacer layer material that reduce the dielectric constant. Due in part to the reduced dielectric constant, the resulting spacer layer reduces the capacitive coupling between the gate stack and the source/drain contact.

In further embodiments, the technique forms a sidewall spacer with a dielectric hard mask layer disposed proximate to the gate stack and a doped spacer layer disposed on the dielectric hard mask layer. The doped spacer layer may include dopants such as boron or phosphorus. The dopants act to reduce the dielectric constant of the doped spacer layer and, by extension, reduce the capacitive coupling between the gate stack and the source/drain contact.

In these examples and others, the sidewall spacer has a reduced dielectric constant compared to a conventional spacer. In turn, the reduced dielectric constant may reduce the capacitance between the gate and the source/drain contact. The lower capacitance may increase device switching speed, reduce switching power, reduce parasitic power loss, and, in some examples, may avoid transient events, such as logic glitches caused by irregularities in switching behavior. However, unless otherwise noted, no embodiment is required to provide any particular advantage.

Examples of the technique and the resulting structure are described with reference to FIGS. 1A-13B. In particular, FIGS. 1A and 1B are flow diagrams of a method 100 of forming an integrated circuit according to various aspects of the present disclosure. Additional steps can be provided before, during, and after the method 100, and some of the steps described can be replaced or eliminated for other examples of the method 100. FIGS. 2-13B are cross-sectional diagrams of a portion of a workpiece 200 undergoing the method of forming an integrated circuit according to various aspects of the present disclosure. FIGS. 2-13B have been simplified for the sake of clarity and to better illustrate the concepts of the present disclosure. Additional features may be incorporated into the workpiece 200, and some of the features described below may be replaced or eliminated for other examples of the workpiece 200.

Figure 2:
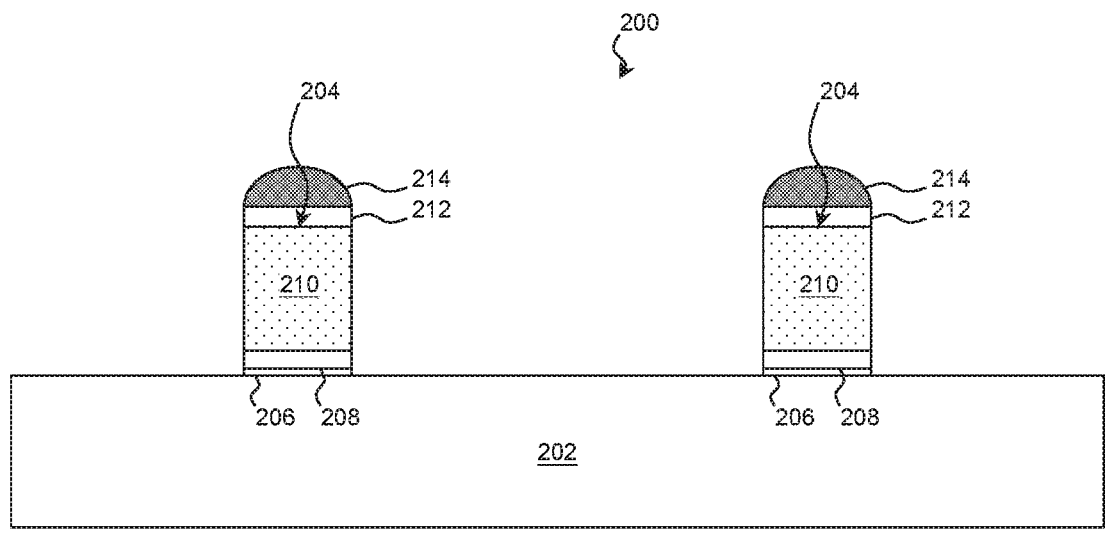
FIGS. 2-13B are cross-sectional diagrams of a portion of a workpiece undergoing the method of forming an integrated circuit according to various aspects of the present disclosure.

Referring to block 102 of FIG. 1A and to FIG. 2, the workpiece 200 is received. The workpiece 200 includes a substrate 202, which may have one or more features formed upon it. In various embodiments, the substrate 202 includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof.

The substrate 202 may be uniform in composition or may include various layers. The layers may have similar or different compositions. For example, a silicon-on-insulator (SOI) substrate 202 includes an insulator layer, such as a semiconductor oxide, a semiconductor nitride, a semiconductor oxynitride, a semiconductor carbide, and/or other suitable insulator materials for electrical isolation. In further examples, the substrate 202 includes layers with different semiconductor lattice arrangements to induce device strain and thereby tune device performance.

Some elements of an integrated circuit device may already be formed on the substrate 202 when it is received in block 102. For example, the workpiece 200 may have a gate stack 204 disposed on the substrate 202. The gate stack 204 may include an interfacial layer 206 where it meets the substrate 202. The interfacial layer 206 may include an interfacial material, such as a semiconductor oxide, semiconductor nitride, semiconductor oxynitride, other semiconductor dielectrics, other suitable interfacial materials, and/or combinations thereof. The interfacial layer 206 may be formed to any suitable thickness using any suitable process including thermal growth, atomic layer deposition (ALD), chemical vapor deposition (CVD), high-density plasma CVD (HDP-CVD), physical vapor deposition (PVD), spin-on deposition, and/or other suitable deposition processes.

The gate stack 204 may also include a gate dielectric 208 disposed on the interfacial layer 206. The gate dielectric 208 may include one or more dielectric materials, which are commonly characterized by their dielectric constant relative to silicon dioxide. In some embodiments, the gate dielectric 208 includes a high-k dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric 208 may include other dielectrics, such as a semiconductor oxide, semiconductor nitride, semiconductor oxynitride, semiconductor carbide, amorphous carbon, tetraethylorthosilicate (TEOS), other suitable dielectric material, and/or combinations thereof. The gate dielectric 208 may be formed to any suitable thickness using any suitable process including ALD, CVD, HDP-CVD, PVD, spin-on deposition, and/or other suitable deposition processes.

In some embodiments, the gate stack 204 includes a gate electrode 210 disposed on the gate dielectric 208. It is noted that the gate electrode 210, gate dielectric 208 and/or interfacial layer 206 may be placeholders. For example in a gate-last process, a temporary gate electrode material is used as a placeholder during some of the fabrication processes. The temporary gate electrode material is subsequently removed and replaced with a functional gate electrode material, such as metal. This may be done when the functional material (e.g., gate electrode material, gate dielectric layer material, interfacial layer, etc.) is sensitive to some fabrication processes, such as annealing. Accordingly when the workpiece 200 is received, the gate electrode 210 may be a placeholder gate electrode or a functional gate electrode. A placeholder gate electrode 210 may include polysilicon, dielectric material, and/or other suitable materials. In contrast, a functional gate electrode 210 may include tungsten, aluminum, copper, titanium, tantalum, molybdenum, ruthenium, tantalum nitride, nickel silicide, cobalt silicide, TiN, WN, TiAl, TiAlN, TaCN, TaC, TaSiN, metal alloy, polysilicon, other suitable materials, and/or combinations thereof.

The workpiece 200 may also include one or more masking layers disposed on the gate electrode 210. In the illustrated embodiments, the workpiece 200 includes a first hard mask layer 212 and a second hard mask layer 214 disposed on the gate electrode 210. Each of the first hard mask layer 212 and second hard mask layer 214 may include any suitable masking material, such as: a dielectric material (e.g., a semiconductor oxide, a semiconductor nitride, a semiconductor oxynitride, a semiconductor carbide, a semiconductor oxycarbonitride, etc.), polysilicon, Spin-On Glass (SOG), TEOS, Plasma Enhanced CVD oxide (PE-oxide), High-Aspect-Ratio-Process (HARP)-formed oxide, and/or other suitable materials. The first hard mask layer 212 and second hard mask layer 214 may be formed to any suitable thickness using any suitable process including ALD, CVD, HDP-CVD, PVD, spin-on deposition, and/or other suitable deposition processes. In an embodiment, the first hard mask layer 212 includes silicon oxycarbonitride, and the second hard mask layer 214 includes polysilicon. While the first hard mask layer 212 and the second hard mask layer 214 may have any suitable thickness and shape, in some examples, the second hard mask layer 214 has a rounded profile due to various fabrication processes, such as etching a layer of gate electrode 210 material and/or gate dielectric 208 material to define the gate stack 204.

Figure 3:
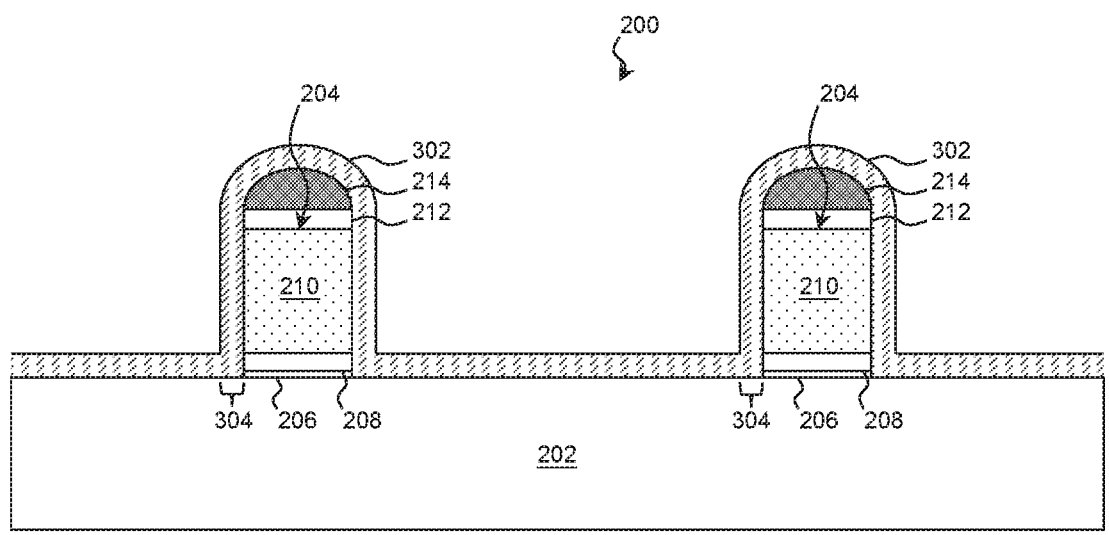

Referring to block 104 of FIG. 1A and to FIG. 3, an inner spacer layer 302 is formed on the workpiece 200. The inner spacer layer 302 may be formed on exposed portions of the substrate 202 as well as on the gate stack 204. In particular, the inner spacer layer 302 may be formed on the vertical side surfaces of the gate stack 204 (i.e., on the vertical side surfaces of the interfacial layer 206, gate dielectric 208, and/or gate electrode 210). In this way, the inner spacer layer 302 begins to define a sidewall spacer 304 of the gate stack 204.

The inner spacer layer 302 may include any suitable masking material, such as: a dielectric material (e.g., a semiconductor oxide, a semiconductor nitride, a semiconductor oxynitride, a semiconductor carbide, a semiconductor oxycarbonitride, etc.), polysilicon, SOG, TEOS, PE-oxide, HARP-formed oxide, and/or other suitable material. In one such embodiment, the inner spacer layer 302 includes silicon oxycarbonitride. The inner spacer layer 302 may be formed to any suitable thickness using any suitable deposition technique (e.g., CVD, HDP-CVD, ALD, etc.). In various embodiments, the inner spacer layer 302 has a thickness between about 1 nm and about 10 nm and is deposited by a conformal CVD and/or ALD process.

Figure 4:
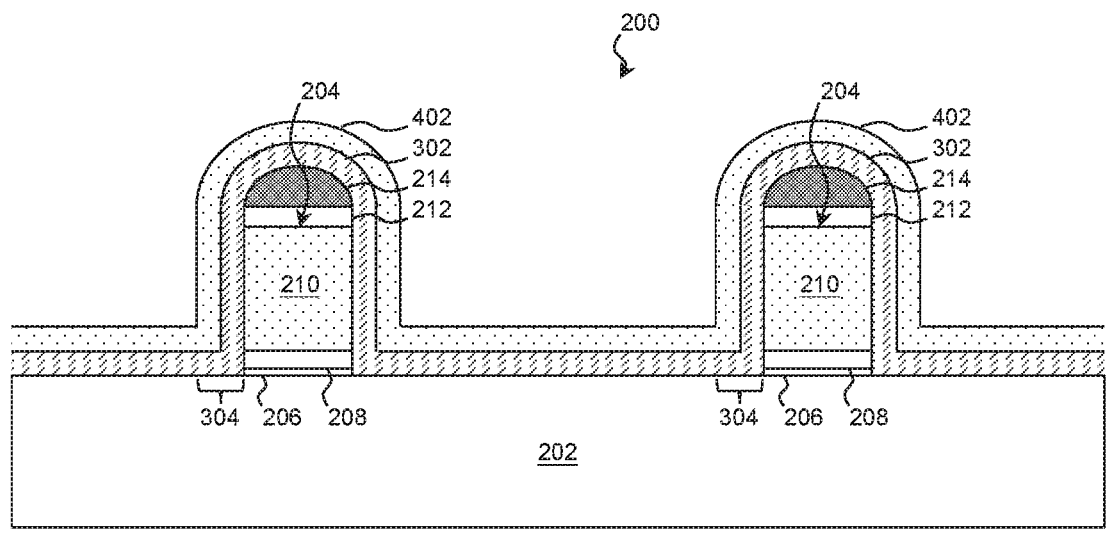

Referring to block 106 of FIG. 1A and to FIG. 4, a low-k precursor 402 is formed on the workpiece 200. In that regard, the low-k precursor 402 may be formed on the inner spacer layer 302, and in particular, on the vertical side surfaces of the inner spacer layer 302 adjacent the gate stack 204. In this way, the low-k precursor 402 further defines the sidewall spacer 304 of the gate stack 204. Within the sidewall spacer 304, a portion of the inner spacer layer 302 separates the low-k precursor 402 from the substrate 202 in some embodiments. Additionally or in the alternative, the low-k precursor 402 may contact the substrate 202 within the sidewall spacer 304.

The low-k precursor 402 may include one or more precursor materials that form a low-k dielectric material when processed. Whereas silicon dioxide has a dielectric constant of about 3.9, in various examples, the low-k precursor 402 is used to form a material with a dielectric constant between about 3.9 and about 1. In some examples, the low-k precursor 402 includes a combination of a dielectric precursor (e.g., TEOS, tetramethoxysilane (TMOS), methyltrimethoxysilane (MTMS), methyltriethoxysilane (MTES), diethoxy methyl silane (DEMS), etc.) and a porogen (e.g., α-Terpinene (ATRP), polystyrene, etc.). The low-k precursor 402 may be formed to any suitable thickness using any suitable deposition technique (e.g., CVD, HDP-CVD, ALD, etc.). In some examples, the low-k precursor 402 has a thickness between about 1 nm and about 10 nm and is deposited by conformal CVD and/or ALD process. Forming the low-k precursor 402 may include introducing a carbon-based porogen (e.g., $CO_2$) into the low-k precursor 402 after the precursor is deposited by exposing the workpiece to a carbon-based plasma.

Figure 5:
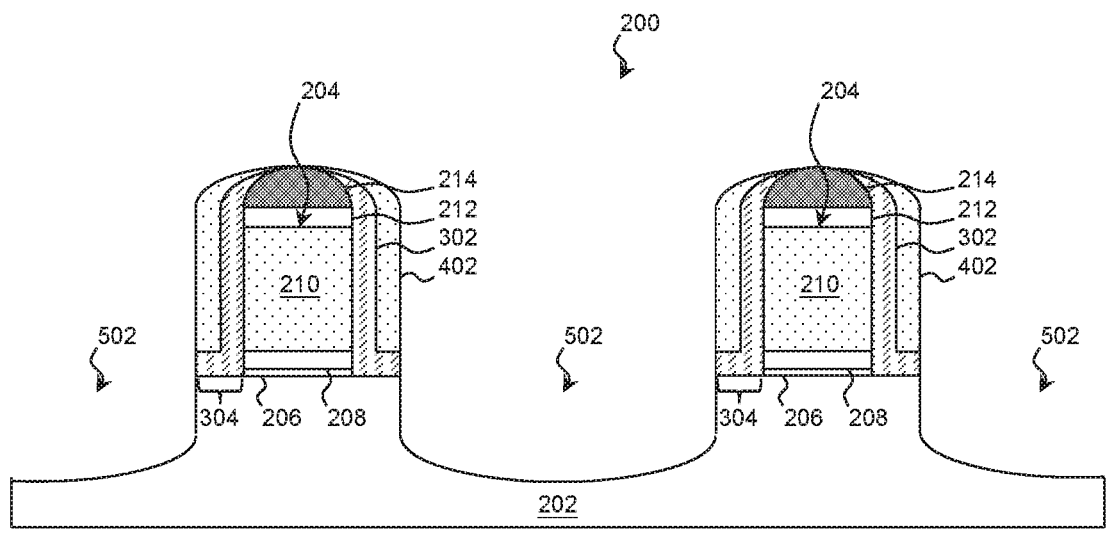

Referring to block 108 of FIG. 1A and to FIG. 5, an etching process is performed on the workpiece 200 to create recesses 502 in which to form source/drain regions. The etching process may be performed using any suitable etching method, such as wet etching, dry etching, Reactive Ion Etching (RIE), ashing, and/or other etching methods and may use any suitable etchant chemistries, such as carbon tetrafluoride ($CF_4$), difluoromethane ($CH_2F_2$), trifluoromethane ($CHF_3$), other suitable etchants, and/or combinations thereof. The etching methods and the etchant chemistries may vary as the low-k precursor 402, inner spacer layer 302, and substrate 202 are etched to target the particular material being etched while minimizing unintended etching of the materials not being targeted. In some such example, the etching process is configured to anisotropically etch the portions of the low-k precursor 402 and the inner spacer layer 302 located directly on the substrate 202, while leaving the portions of the low-k precursor 402 and the inner spacer layer 302 on the vertical sidewalls of the gate stack 204. The etching process may expose some of the second hard mask layer 214. However in general, the first hard mask layer 212 and the second hard mask layer 214 protect the gate stack from the etching process.

Figure 6:
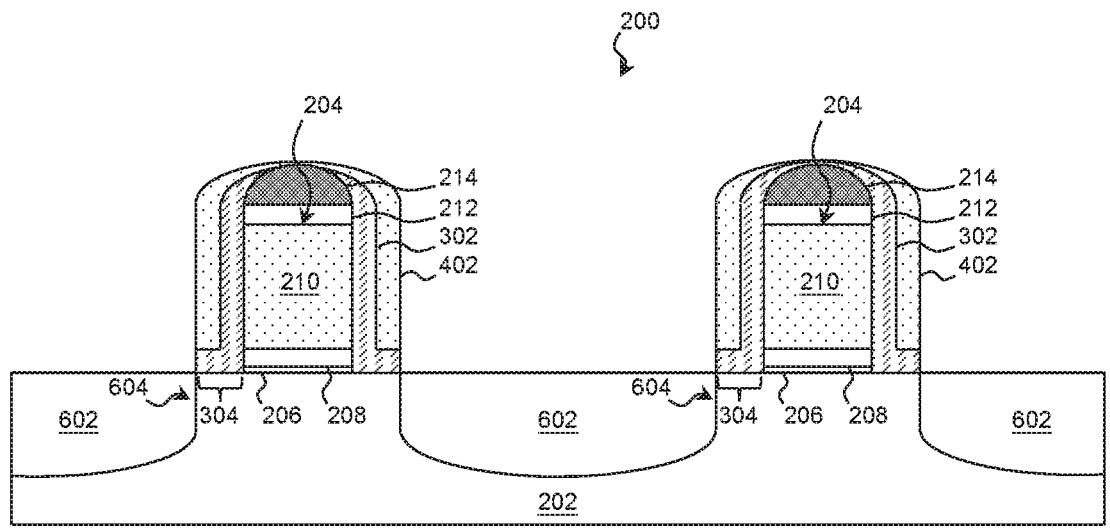

Referring to block 110 of FIG. 1A and to FIG. 6, an epitaxy process is performed on the workpiece 200 to grow source/drain regions 602 within the recesses 502. In various examples, the epitaxy process includes a CVD deposition technique (e.g., Vapor-Phase Epitaxy (VPE) and/or Ultra-High Vacuum CVD (UHV-CVD)), molecular beam epitaxy, and/or other suitable processes. The epitaxy process may use gaseous and/or liquid precursors, which interact with a component of the substrate 202 (e.g., silicon) to form the source/drain regions 602. The resultant source/drain regions 602 may be in-situ doped to include p-type dopants, such as boron or $BF_2$; n-type dopants, such as phosphorus or arsenic; and/or other suitable dopants including combinations thereof. Additionally or in the alternative, the source/drain regions 602 may be doped using an implantation process (i.e., a junction implant process) after the source/drain regions 602 are formed. Once the dopant(s) are introduced, a dopant activation processes, such as Rapid Thermal Annealing (RTA) and/or a laser annealing processes, may be performed to activate the dopants within the source/drain regions 602 as shown in block 112 of FIG. 1A.

The source/drain regions 602 may have any suitable shape, and in some examples, the source/drain regions 602 have a substantially u-shaped profile where a vertical sidewall portion of each of the source/drain regions 602 indicated by marker 604 is substantially aligned with an outer vertical surface of the low-k precursor 402 (and by extension aligned with the outer vertical surface of the sidewall spacer 304). Furthermore in some examples, halo/pocket implantation is performed on the substrate 202, and as a result, the source/drain regions 602 extend underneath the sidewall spacer 304.

Figure 7:
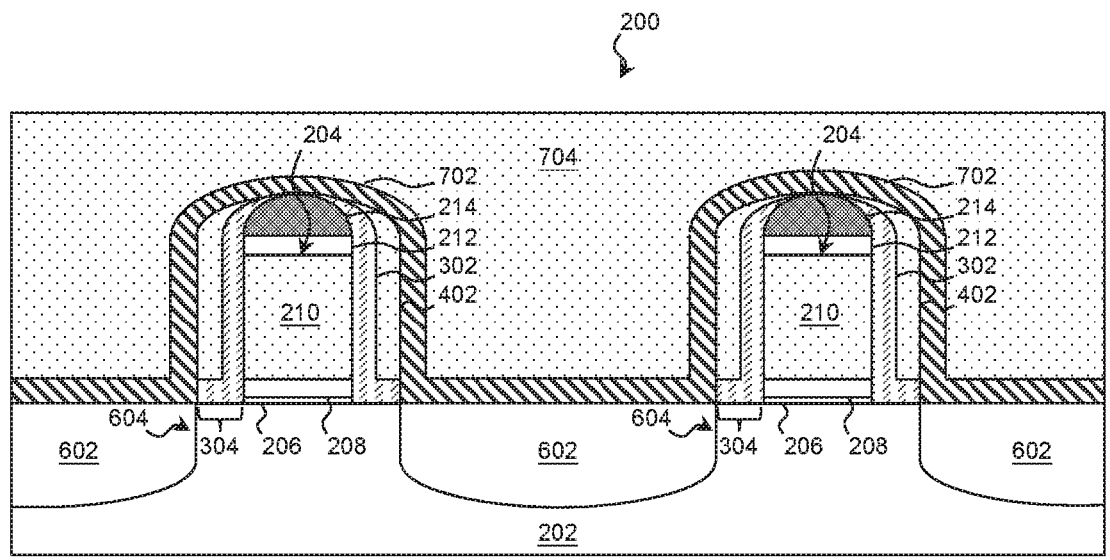

Referring to block 114 of FIG. 1A and to FIG. 7, a Contact Etch Stop Layer (CESL) 702 is formed on the workpiece 200. The CESL 702 may be formed on the source/drain regions 602 and on the gate stack 204, and in particular, on the vertical side surfaces of the low-k precursor 402 adjacent the gate stack 204. The CESL 702 may include any suitable material, such as: a dielectric material (e.g., a semiconductor oxide, a semiconductor nitride, a semiconductor oxynitride, a semiconductor carbide, a semiconductor oxycarbonitride, etc.), polysilicon, SOG, TEOS, PE-oxide, HARP-formed oxide, and/or other suitable material. In some examples, the CESL 702 includes silicon oxycarbonitride. The CESL 702 may be formed to any suitable thickness using any suitable deposition technique (e.g., CVD, HDP-CVD, ALD, etc.). In some examples, the CESL 702 has a thickness between about 1 nm and about 10 nm, and is deposited by a conformal CVD and/or ALD process.

Referring to block 116 of FIG. 1A and referring still to FIG. 7, a first Inter-Level Dielectric (ILD) layer 704 is formed on the workpiece 200. The first ILD layer 704 acts as an insulator that supports and isolates conductive traces of an electrical multi-level interconnect structure that electrically interconnects elements of the workpiece 200, such as the source/drain regions 602 and the gate electrode 210. The first ILD layer 704 may comprise a dielectric material (e.g., a semiconductor oxide, a semiconductor nitride, a semiconductor oxynitride, a semiconductor carbide, etc.), SOG, fluoride-doped silicate glass (FSG), phosphosilicate glass (PSG), borophosphosilicate glass (BPSG), Black Diamond® (Applied Materials of Santa Clara, Calif.), Xerogel, Aerogel, amorphous fluorinated carbon, parylene, BCB, SILK® (Dow Chemical of Midland, Mich.), and/or combinations thereof. The first ILD layer 704 may be formed by any suitable process including CVD, PVD, spin-on deposition, and/or other suitable processes.

Figure 8:
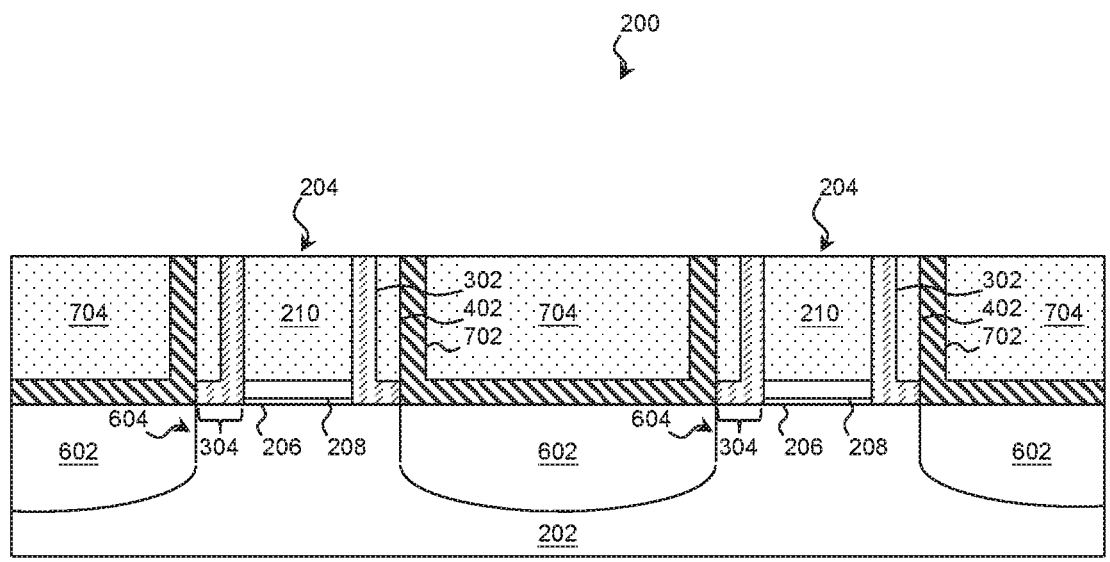

Referring to block 118 of FIG. 1B and to FIG. 8, a chemical mechanical polish/planarization (CMP) process is performed on the workpiece 200. The CMP process may remove some or all of the first hard mask layer 212 and the second hard mask layer 214 from the gate electrode 210, and may be followed by a hard mask etch back to remove any remaining material from the gate electrode 210. The hard mask etch back process may be performed using any suitable etching method, such as wet etching, dry etching, RIE, ashing, etc. using any suitable etchant chemistry configured to selectively remove the first hard mask layer 212 and/or the second hard mask layer 214.

Figure 9:
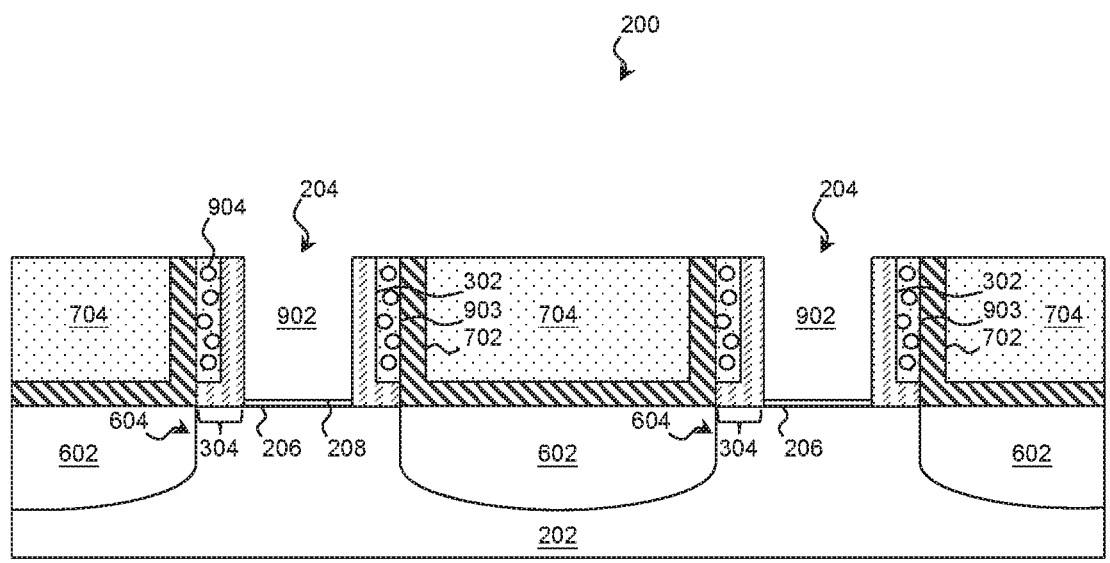

Referring to block 120 of FIG. 1B and to FIG. 9, in examples where any components of the gate stack 204 (e.g., the gate electrode 210, the gate dielectric 208, and/or the interfacial layer 206) are placeholders, the placeholder components are removed as part of a gate replacement process. In the illustrated example, at least the gate electrode 210 and the gate dielectric are removed to provide a recess 902 within the gate stack 204. Removing the placeholder components of the gate stack 204 may include one or more etching processes (e.g., wet etching, dry etching, RIE) using an etchant chemistry configured to selectively etch the material of the particular placeholder component being targeted without significant etching of surrounding materials such as the inner spacer layer 302, the low-k precursor 402, the first ILD layer 704, the CESL 702, etc.

Referring to block 122 of FIG. 1B and referring still to FIG. 9, a curing process is performed on the workpiece 200. The curing process is configured to convert the low-k precursor 402 into a low-k spacer layer 903. For example, the curing process may drive off a porogen from the precursor 402 leaving voids 904 (enlarged for clarity) in the low-k spacer layer 903. The voids 904 may reduce the dielectric constant of the remaining material of low-k spacer layer 903. The removal of the placeholder gate electrode 210 may promote the removal of the porogen by allowing it to escape through the sides of the low-k spacer layer 903 (through the inner spacer layer 302) by way of the recess 902. In other examples, the curing process causes the porogen to organize the molecular structure of the precursor to create voids 904 in low-k spacer layer 903 without driving off the porogen.

The curing process may utilize any suitable technique. The curing process may utilize heat and/or radiation such as ultraviolet radiation to cause a chemical change in the low-k precursor 402 to form the low-k spacer layer 903. In various examples, the workpiece 200 is heated in a vacuum or an inert-gas environment to a temperature between about 350° C. and about 450° C. While heated, the workpiece 200 is exposed to radiation having one or more wavelengths between about 150 nm and about 250 nm for between about 50 and about 150 seconds. In further examples, curing includes heating at least part of the workpiece 200 to a temperature between about 350° C. and about 450° C. using a micro-annealing process.

After the curing process, the low-k spacer layer 903 may have a dielectric constant between about 3.9 and about 1, and in some examples, the low-k spacer layer 903 has a dielectric constant of about 3.

Figure 10:
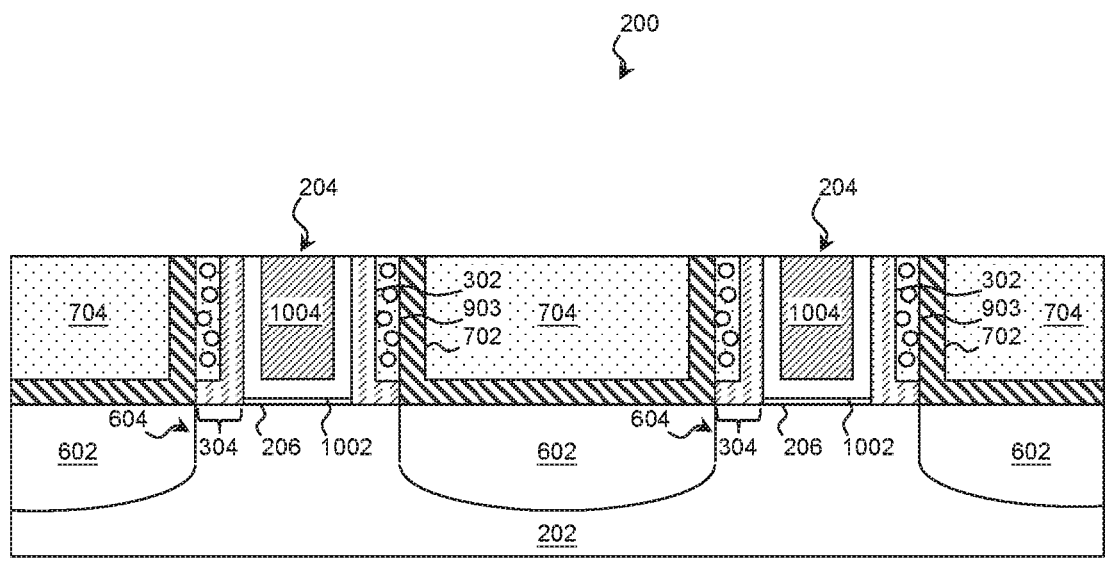

Referring to block 124 of FIG. 1B and to FIG. 10, replacement elements of the gate stack 204, such as a replacement gate dielectric 1002, a replacement gate electrode 1004, are formed on the workpiece 200 within the recess 902. The replacement gate dielectric 1002 and the replacement gate electrode 1004 may be different in composition from the gate dielectric 208 and the gate electrode 210 that was previously removed. For example, the replacement gate dielectric 1002 may include a high-k dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The replacement gate dielectric 1002 may extend horizontally along the substrate 202 and vertically along some or all of the inner spacer layer 302. The replacement gate dielectric 1002 may be formed to any suitable thickness using any suitable process including ALD, CVD, HDP-CVD, PVD, spin-on deposition, and/or other suitable deposition processes.

Turning to the replacement gate electrode 1004, the gate electrode 1004 includes one or more metal-containing layers, such as a capping layer, a work function layer, a barrier layer, and/or an electrode fill. Examples of these layers are shown and described in more detail below.

Figure 11:
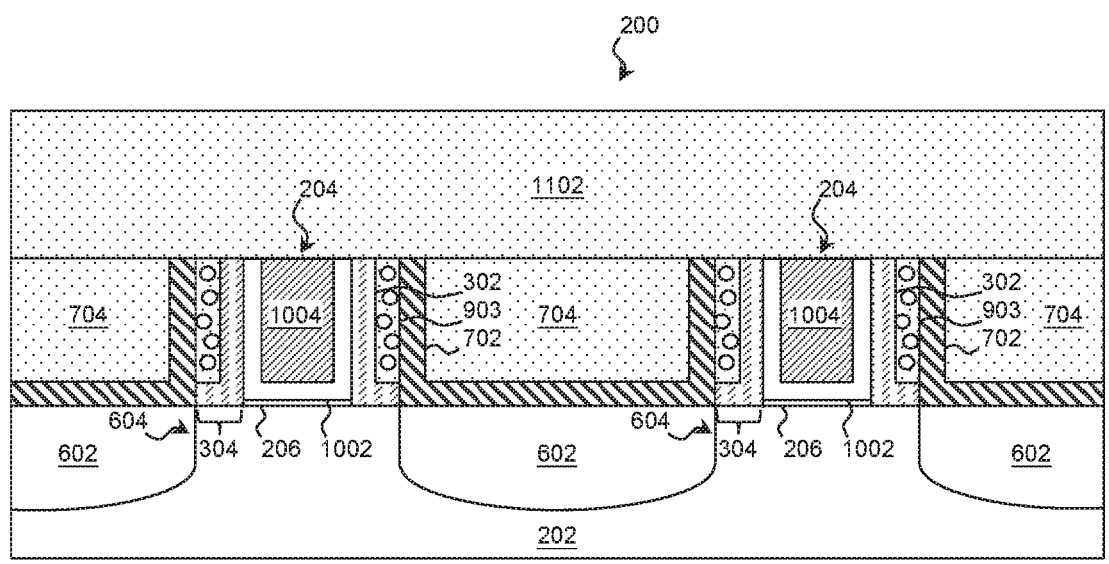

Referring to block 126 of FIG. 1B and to FIG. 11, a second ILD layer 1102 may be formed on the workpiece 200. Similar to the first ILD layer 704, the second ILD layer 1102 acts as an insulator that supports and isolates conductive traces of the multi-level interconnect structure. Also similar to the first ILD layer 704, the second ILD layer 1102 may include any suitable dielectric material and may be formed by any suitable process including CVD, PVD, spin-on deposition, and/or other suitable processes.

Figure 12:
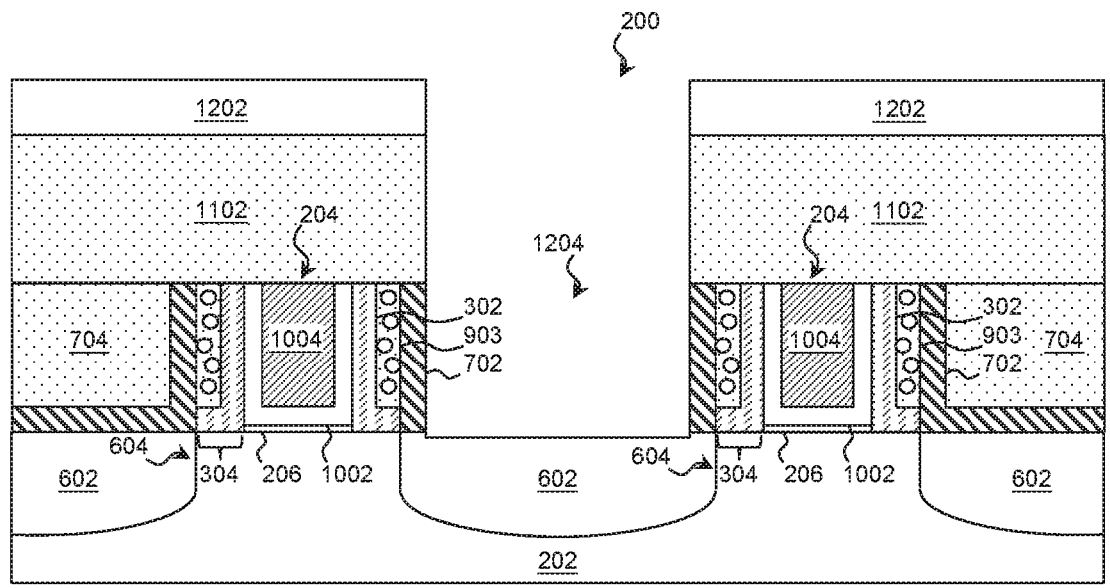

Referring to block 128 of FIG. 1B and to FIG. 12, contact-open etching is performed on the workpiece 200 to expose the source/drain regions 602 where contacts are to be formed. The contact-open etching may include forming a photoresist layer 1202 on the workpiece. An exemplary photoresist layer 1202 includes a photosensitive material that causes the layer to undergo a property change when exposed to light. This property change can be used to selectively remove exposed or unexposed portions of the photoresist layer in a process referred to as lithographic patterning. In one such embodiment, a photolithographic system exposes the photoresist layer 1202 to radiation in a particular pattern determined by a mask. Light passing through or reflecting off the mask strikes the photoresist layer 1202 thereby transferring a pattern formed on the mask to the photoresist 1202. In other such examples, the photoresist layer 1202 is patterned using a direct write or maskless lithographic technique, such as laser patterning, e-beam patterning, and/or ion-beam patterning. Once exposed, the photoresist layer 1202 is developed leaving the exposed portions of the resist, or in alternative examples, leaving the unexposed portions of the resist. An exemplary patterning process includes soft baking of the photoresist layer 1202, mask aligning, exposure, post-exposure baking, developing the photoresist layer 1202, rinsing, and drying (e.g., hard baking).

The patterned photoresist layer 1202 exposes portions of the second ILD layer 1102 to be etched. Accordingly, after patterning the photoresist layer 1202, one or more etching processes may be performed on the workpiece 200 to open those portions of the second ILD layer 1102, the first ILD layer 704, and the CESL 702 not covered by the photoresist layer 1202. The etching processes may include any suitable etching technique, such as wet etching, dry etching, RIE, ashing, and/or other etching methods. In some examples, etching includes multiple etching steps with different etching chemistries, each targeting a particular material of the workpiece 200. The contact-open etching of block 128 leaves a recess 1204 exposing the source/drain region 602 where a contact is to be formed. The recess 1204 may extend into the source/drain region 602 to increase the contact surface area between the source/drain region 602 and the contact.

Figure 13A:
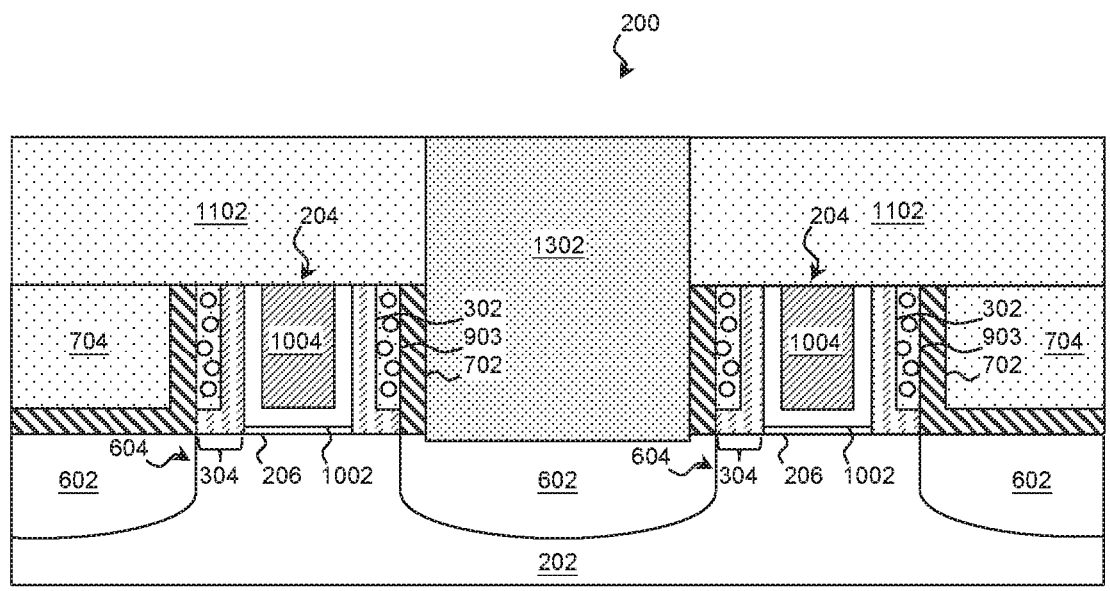

Referring to block 130 of FIG. 1B and to FIG. 13A, the source/drain contact 1302 is formed on the workpiece 200 within the recess 1204 and is physically and electrically coupled to the source/drain region 602. The contact 1302 may include any suitable conductive material, such as W, Al, Cu, Ti, Ag, Ru, Mo, TiN, WN, TiAl, TiAlN, TaCN, TaC, TaSiN, metal alloy, metal silicide, and/or other suitable materials. The contact 1302 material(s) may be deposited using any suitable process, such as CVD, PVD, sputtering, plating, and/or other suitable processes. A CMP process may be performed after deposition of to remove any excess material on, for example, the second ILD layer 1102.

The contact 1302 may extend between the vertical portions of the CESL 702 and the sidewall spacer 304 such that the CESL 702 and the sidewall spacer 304 separate the contact 1302 from the adjacent gate stack(s) 204. It has been determined that such an arrangement produces a capacitive coupling between the contact 1302 and the gate stack 204. In some examples, the resulting capacitance affects the switching speed and/or the threshold voltage of the associated transistor. However, the structure and composition of the low-k spacer layer 903 may act to reduce this gate-contact capacitance. In particular, the low-k dielectric material of the low-k spacer layer 903 formed by the deposition of the precursor in block 106 and the curing process of block 122 reduces this capacitance compared to other configurations.

Referring now to FIG. 13B, the inner spacer layer 302, the low-k spacer layer 903, the CESL 702, the gate stack 204, and the surrounding structures of the workpiece 200 are enlarged for greater detail. In particular, individual elements of the replacement gate electrode 1004 are shown. As noted above, the replacement gate electrode 1004 may include layers such as a capping layer 1304, a barrier layer 1306, one or more work function layer(s) 1308, an electrode fill 1310, etc.

Referring first to the capping layer 1304, the capping layer 1304 may be disposed on the horizontal surfaces of the replacement gate dielectric 1002 as well as the vertical surfaces of the replacement gate dielectric 1002 that extend vertically along the inner spacer layer 302. The capping layer 706 may include any suitable conductive material including metals (e.g., W, Al, Ta, Ti, Ni, Cu, Co, etc.), metal nitrides, and/or metal silicon nitrides, and may be deposited via CVD, ALD, PE CVD, PEALD, PVD, and/or other suitable deposition process. In various embodiments, the capping layer 1304 includes TaSiN, TaN, or TiN.

A barrier layer 1306 may be disposed on the horizontal and vertical surfaces of the capping layer 1304. The barrier layer 1306 may contain any suitable material, such as W, Ti, TiN, Ru, or combinations thereof. Materials for the barrier layer 1306 may be selected based on their resilience to diffusion into the capping layer 1304. The barrier layer 1306 may be deposited by any suitable technique including ALD, CVD, PE CVD, PEALD, PVD (e.g., sputtering), and/or combinations thereof.

One or more work function layer(s) 1308 are disposed on the horizontal and vertical surfaces of the capping layer 1304. Suitable work function layer 1308 materials include n-type and/or p-type work function materials based on the type of device to which the gate stack 204 corresponds. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer(s) 1308 may be deposited by any suitable technique including ALD, CVD, PE CVD, PEALD, PVD, and/or combinations thereof.

An electrode fill 1310 is disposed on the work function layer(s) 1308. The electrode fill 1310 may include any suitable material including metals (e.g., W, Al, Ta, Ti, Ni, Cu, Co, etc.), metal oxides, metal nitrides and/or combinations thereof, and in an example, the electrode core includes tungsten (W). The electrode fill 1310 may be deposited by any suitable technique including ALD, CVD, PE CVD, PEALD, PVD, and/or combinations thereof.

As noted above, in various examples, the inner spacer layer 302 has a width 1312 between about 1 nm and about 10 nm, the low-k spacer layer 903 has a width 1314 between about 1 nm and about 10, and the CESL 702 has a width 1316 between about 1 nm and about 10 nm. The height 1318 of the gate stack 204 disposed between these layers (and by extension the height of the inner spacer layer 302 and the CESL 702) is between about 15 nm and about 25 nm in various examples. Accordingly a ratio of height to width for the inner spacer layer 302 and CESL 702 may be between about 1.5:1 and about 25:1. As the inner spacer layer 302 may extend between the low-k spacer layer 903 and the substrate 202, the height of the low-k spacer layer 903 is between about 5 nm and about 25 nm for a corresponding height-to-width ratio of between 0.5:1 and about 25:1 in various examples.

Referring to block 132 of FIG. 1B, the workpiece 200 is provided for further fabrication.

Figure 14A:
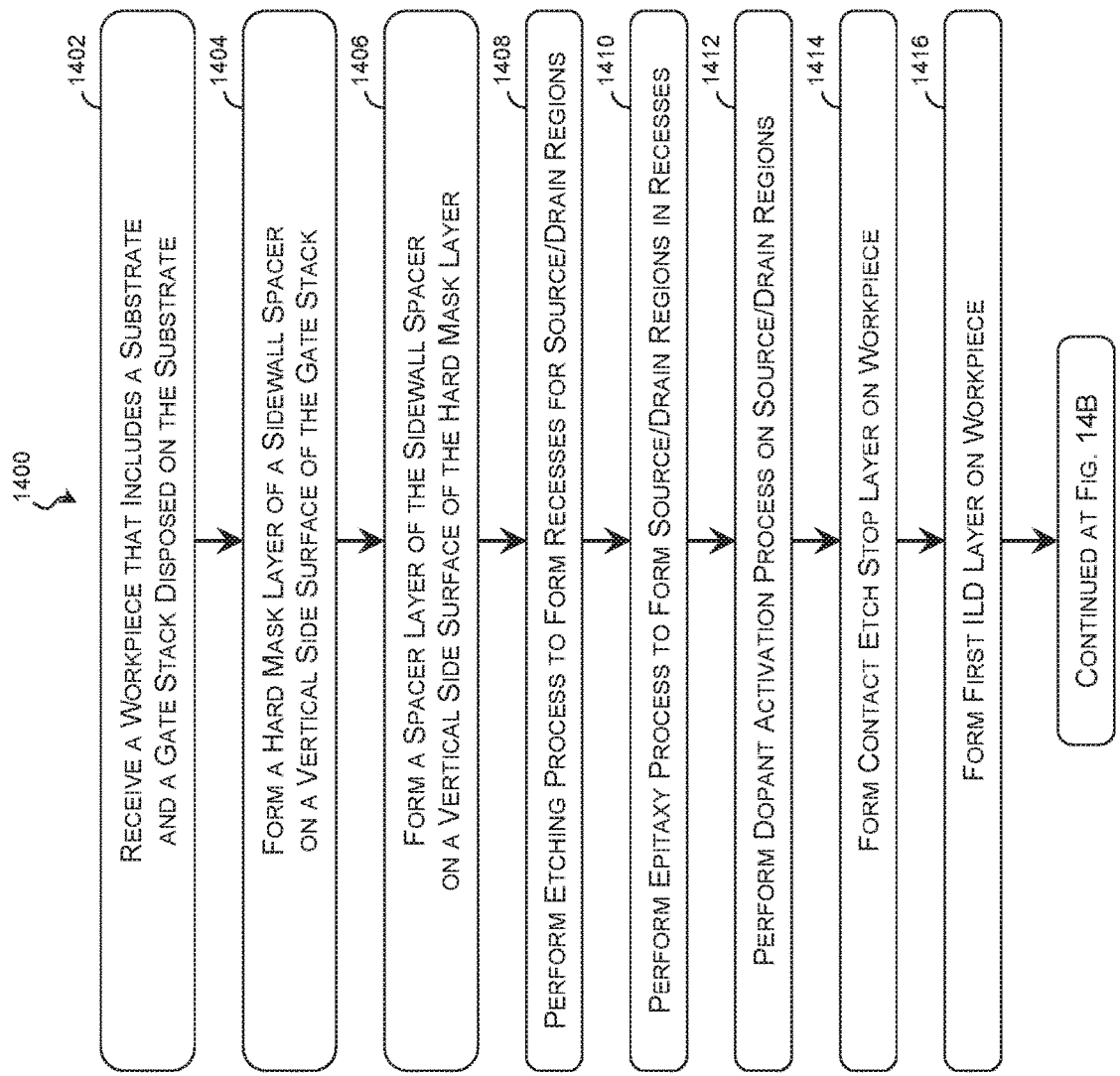

Further examples of the technique and the resulting structure that incorporate different compositions for the spacer layer are described with reference to FIGS. 14A-22B. In that regard, FIGS. 14A and 14B are flow diagrams of a method 1400 of forming an integrated circuit with a doped spacer layer according to various aspects of the present disclosure. Additional steps can be provided before, during, and after the method 1400, and some of the steps described can be replaced or eliminated for other examples of the method 1400. FIGS. 15-22B are cross-sectional diagrams of a portion of a workpiece 1500 undergoing the method of forming an integrated circuit with a doped spacer layer according to various aspects of the present disclosure. FIGS. 15-22B have been simplified for the sake of clarity and to better illustrate the concepts of the present disclosure. Additional features may be incorporated into the workpiece 1500, and some of the features described below may be replaced or eliminated for other examples of the workpiece 1500.

Figure 15:
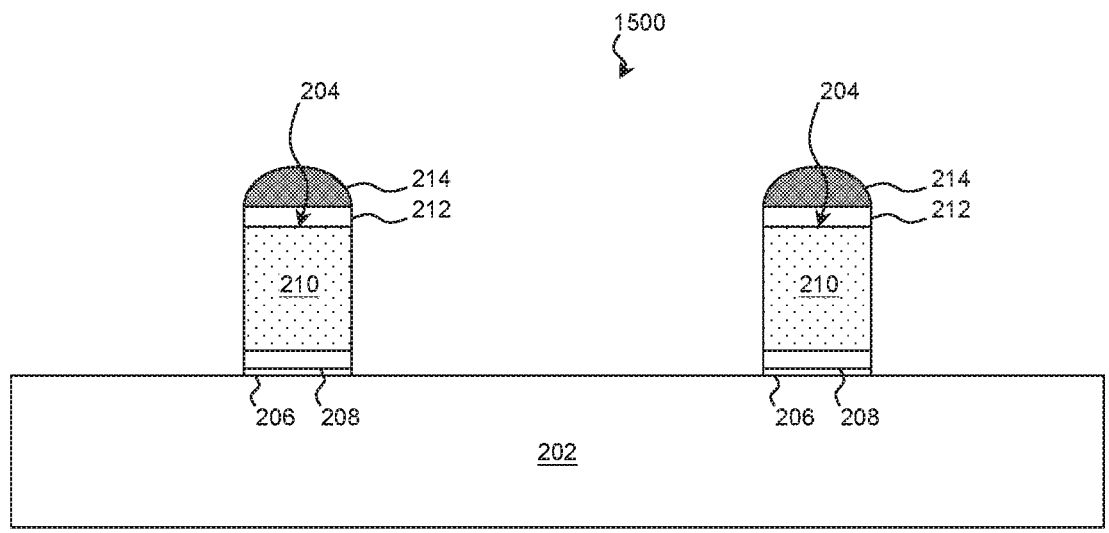
FIGS. 15-22B are cross-sectional diagrams of a portion of a workpiece undergoing the method of forming an integrated circuit with a doped spacer layer according to various aspects of the present disclosure.

Referring to block 1402 of FIG. 14A and to FIG. 15, the workpiece 1500 is received. The workpiece 1500 may be substantially similar to workpiece 200 and may include a substrate 202, a gate stack 204 (with an interfacial layer 206, gate dielectric 208, and/or a gate electrode 210), a first hard mask layer 212, and/or a second hard mask layer 214, each substantially as described above.

Figure 16:
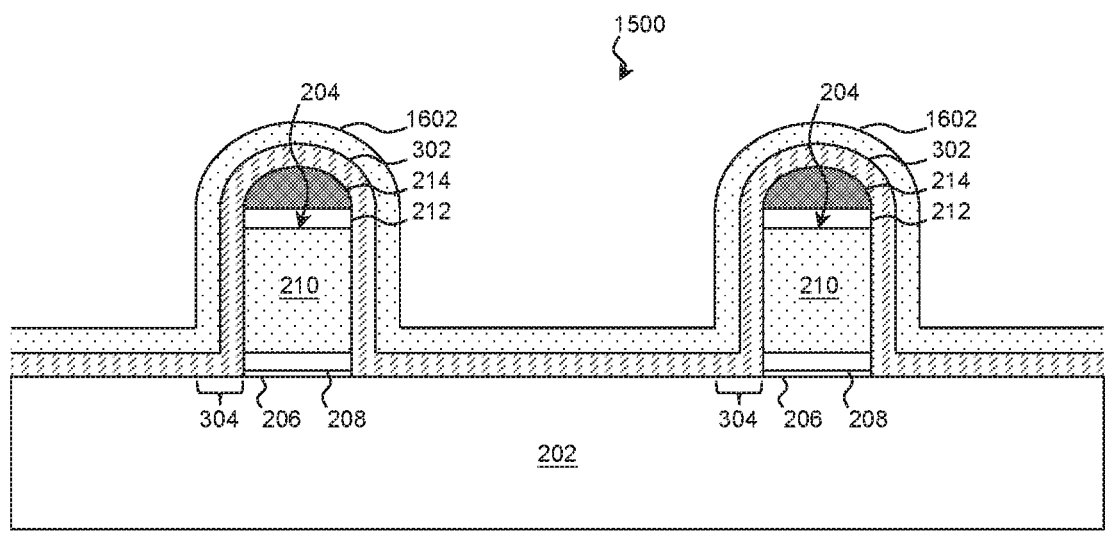

Referring to block 1404 of FIG. 14A and to FIG. 16, an inner spacer layer 302 is formed on the workpiece 1500. The inner spacer layer 302 may be formed on the vertical side surfaces of the gate stack 204 (i.e., on the vertical side surfaces of the interfacial layer 206, gate dielectric 208, and/or gate electrode 210). The portion of the inner spacer layer 302 on the vertical side surface of a gate stack 204 partially defines a sidewall spacer 304 of the gate stack 204.

The inner spacer layer 302 may be substantially as described above in composition, and in one such example, the inner spacer layer 302 includes silicon oxycarbonitride. The inner spacer layer 302 may be formed to any suitable thickness using any suitable deposition technique (e.g., CVD, HDP-CVD, ALD, etc.). In various examples, the inner spacer layer 302 has a thickness between about 1 nm and about 10 nm and is deposited by a conformal CVD and/or ALD process.

Referring to block 1406 of FIG. 14A and referring still to FIG. 16, a low-k precursor 1602 is formed on the workpiece 1500. In particular, the low-k precursor 1602 may be formed on the vertical side surfaces of the inner spacer layer 302 adjacent the gate stack 204. In this way, the low-k precursor 1602 further defines the sidewall spacer 304 of the gate stack 204.

The low-k precursor 1602 may include any suitable material, and in various examples, the low-k precursor 1602 includes a dielectric material (e.g., a semiconductor oxide, a semiconductor nitride, a semiconductor oxynitride, a semiconductor carbide, a semiconductor oxycarbonitride) doped with a p-type dopant, such as boron or $BF_2$, or an n-type dopant, such as phosphorus or arsenic, to modify the dielectric constant of the dielectric material. The dopant type in the low-k precursor 1602 may be independent of the dopants in the channel region and source/drain regions 602 of the transistor, and the low-k precursor 1602 may be doped with the same type or the opposite type of the dopant in the source/drain regions 602. In various examples, the low-k precursor 1602 includes silicon oxide, silicon nitride, and/or silicon oxynitride and is doped with boron and/or phosphorous. The low-k precursor 1602 may include any suitable concentration of the dopant, and in various examples, the dopant concentration is between about $1 \times 10^{16}$ atoms/cm$^3$ and about $1 \times 10^{21}$ atoms/cm$^3$.

The dopant reduces the capacitive coupling between the gate stack 204 and a contact, and to further reduce the capacitive coupling, the dopant may be introduced into a porous dielectric. In some such examples, the low-k precursor 1602 includes a low-k dielectric precursor (e.g., TEOS, TMOS, MTMS, MTES, DEMS, etc.) and a porogen (e.g., ATRP, polystyrene, etc.) and a p-type or n-type dopant, each as described above.

The low-k precursor 1602 may be formed to any suitable thickness using any suitable deposition technique (e.g., CVD, HDP-CVD, ALD, etc.). In some examples, the low-k precursor 1602 has a thickness between about 1 nm and about 10 nm and is deposited by conformal CVD and/or ALD process. The dopant may be introduced during deposition of the low-k precursor 1602 via an in situ doping process. Additionally or in the alternative, the dopant may be introduced after the low-k precursor 1602 has been deposited using an implantation process (e.g., ion implantation) to implant the dopant.

Referring to block 1408 of FIG. 14A, an etching process is performed on the workpiece 1500 to create recesses in which to form source/drain regions. This may be performed substantially as described in block 108 of FIG. 1A.

Figure 17:
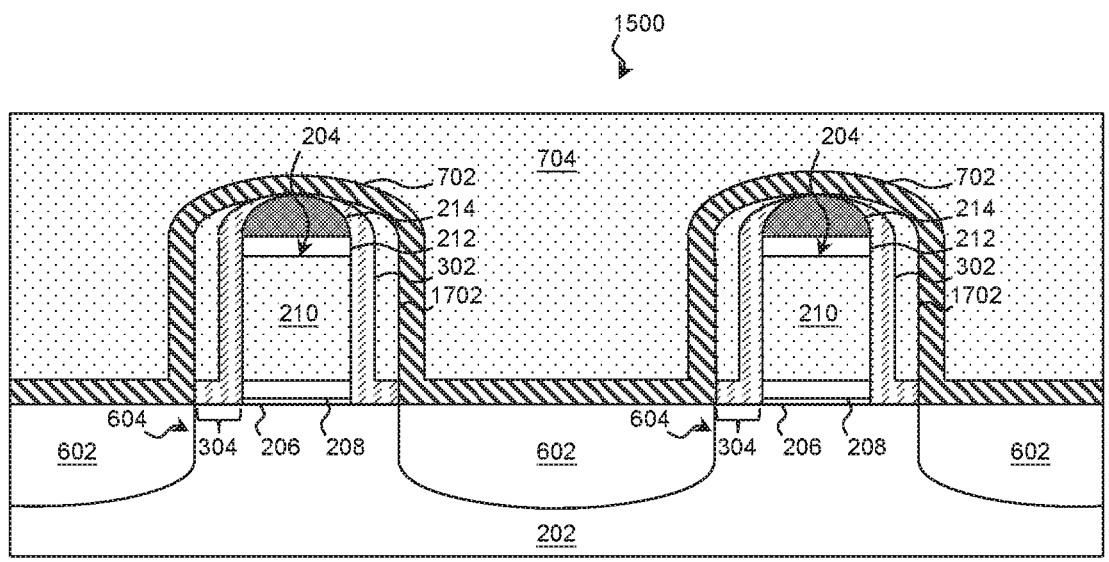
Figure 18:
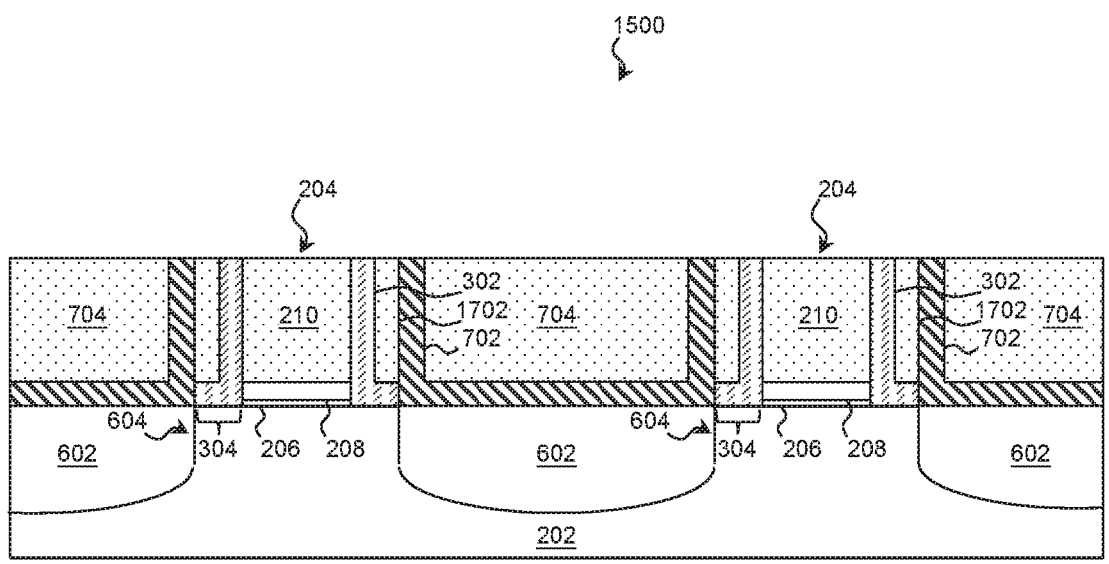
Figure 19:
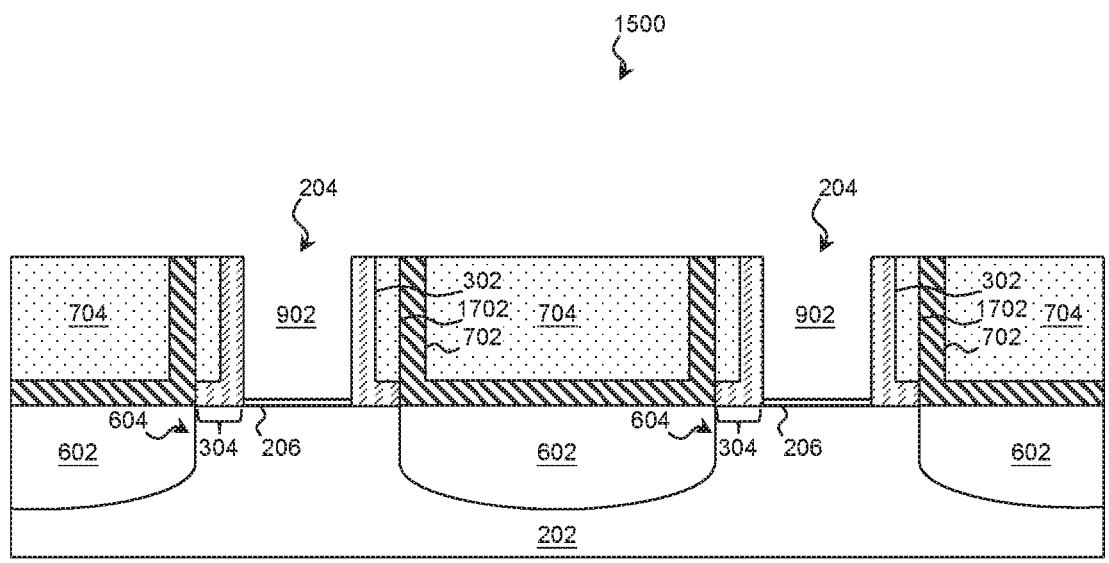

Referring to block 1410 of FIG. 14A and to FIG. 17, an epitaxy process is performed on the workpiece 1500 to grow source/drain regions 602 within the recesses. This may be performed substantially as described in block 110 of FIG. 1A. A dopant activation process may be performed to activate dopants within the source/drain regions 602, such as RTA and/or a laser annealing processes as shown in block 1412 of FIG. 14A. This may be performed substantially as described in block 112 of FIG. 1A. In some examples, the annealing process also activates the dopant within the low-k precursor 1602 to form a low-k spacer layer 1702. Additionally or in the alternative, a separate dopant activation process may be performed to activate the dopant within the low-k precursor 1602 to form the low-k spacer layer 1702 as described in more detail below.

Referring to block 1414 of FIG. 14A and referring still to FIG. 17, a CESL 702 is formed on the workpiece 1500. Referring to block 1416 of FIG. 14A, a first ILD layer 704 is formed on the workpiece 1500. Referring to block 1418 of FIG. 14B and to FIG. 18, a CMP process is performed on the workpiece 1500. Referring to block 1420 of FIG. 14B and to FIG. 19, in examples where any components of the gate stack 204 are placeholders, the placeholder components (such as the gate dielectric 208 and/or the gate electrode 210) are removed as part of a gate replacement process, leaving a recess 902 within the gate stack 204. These processes may be performed substantially as described in blocks 114-120 of FIGS. 1A and 1B.

Referring to block 1422 of FIG. 14B, a dopant activation process is performed on the workpiece 1500 to activate the dopant to form the low-k spacer layer 1702 when the annealing process of block 1412 is not sufficient. In various examples, the dopant activation process may include RTA and/or a laser annealing to heat the workpiece 1500 to a temperature between about 450° C. and about 1050° C. The annealing may be performed for second (or even fractions thereof) using ultra sub-second annealing (uSSA), spike annealing, laser annealing and other rapid annealing techniques; may be performed for hours using furnace annealing; or may be performed for any duration therebetween.

For examples where the low-k precursor 1602 includes a dielectric material precursor and a porogen, a curing process is performed on the workpiece 1500 in block 1424 to convert the low-k precursor 1602 into the low-k spacer layer 1702. This may be performed substantially as described in block 122 of FIG. 1B. The curing process is configured to convert the dielectric material precursor of the low-k precursor 1602 into a low-k dielectric material, and may drive off the porogen or cause the porogen to organize the molecular structure of the precursor to create voids in the low-k precursor 1602 without driving off the porogen. In various examples, the curing process applies radiation, heat, and/or inert or reactive gasses to cure the low-k precursor 1602 and may be performed as part of and concurrent with the dopant activation of block 1422 or separately therefrom. The dopant and/or the voids created by the porogen may reduce the dielectric constant of the low-k precursor 1602 to any suitable value, and in various examples, the low-k spacer layer 1702 has a dielectric constant between about 3.9 and about 1. In one such example, the low-k spacer layer 1702 has a dielectric constant of about 3.

Figure 20:
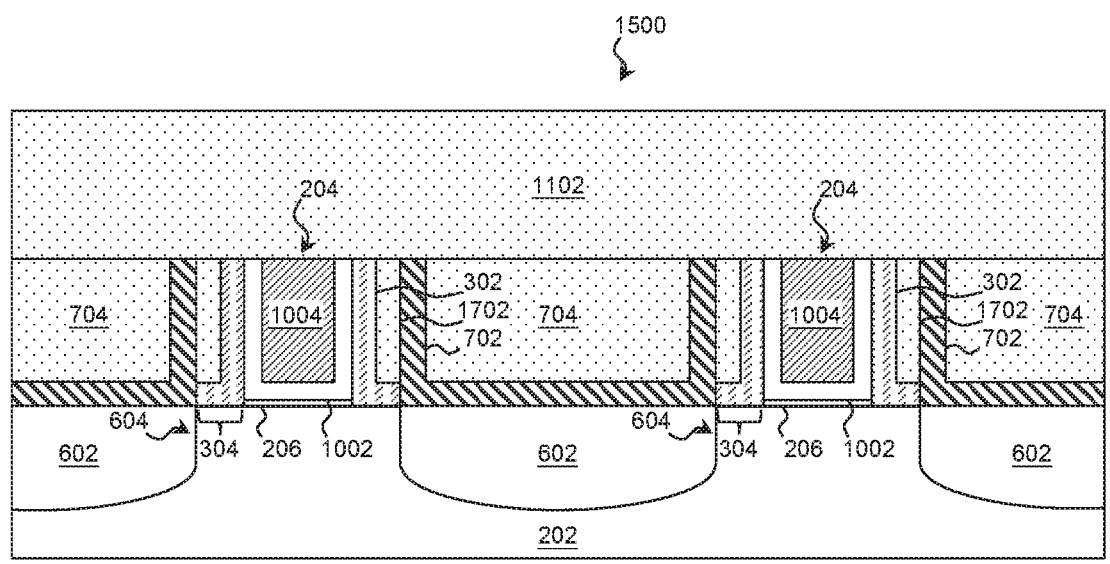
Figure 21:
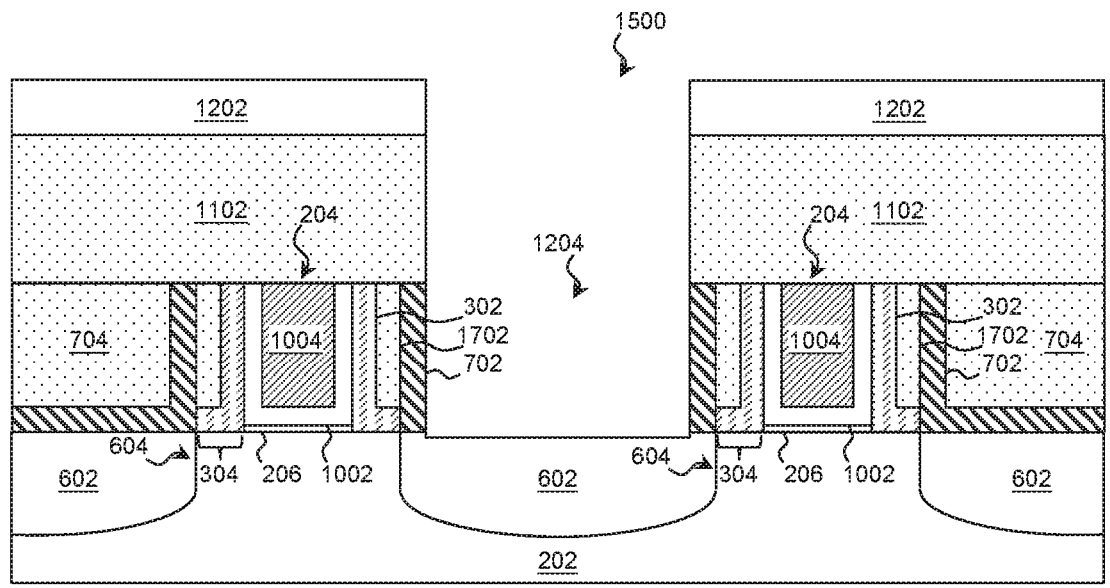

Referring to block 1426 of FIG. 14B and to FIG. 20, replacement elements of the gate stack 204, such as a replacement gate dielectric 1002 and/or a replacement gate electrode 1004, are formed on the workpiece 200 within the recess 902. This may be performed substantially as described in block 124 of FIG. 1B.

Referring to block 1428 of FIG. 14B and referring still to FIG. 20, a second ILD layer 1102 may be formed on the workpiece 1500. Referring to block 1430 of FIG. 14B and to FIG. 21, a contact-open etching is performed on the workpiece 1500 to form recesses that expose the source/drain regions 602 where contacts are to be formed. Referring to block 1432 of FIG. 14B and to FIG. 22A, the source/drain contact 1302 is formed on the workpiece 1500 within the recesses. These processes may be performed substantially as described in blocks 126-130 of FIG. 1B.

The contact 1302 may extend between the vertical portions of the CESL 702 and the sidewall spacer 304 such that the CESL 702 and the sidewall spacer 304 separate the contact 1302 from the adjacent gate stack(s) 204. The structure and composition of the low-k spacer layer 1702 may act to reduce this gate-contact capacitance. In particular, the doped dielectric material of the low-k spacer layer 1702 formed in block 1406 and the dopant activation of blocks 1412 and/or 1422 reduces this capacitance compared to other configurations. In some such examples, the low-k spacer layer 1702 includes a porous low-k dielectric material in which the dopant is deposited that further acts to reduce the gate-contact capacitance.

Figure 22A:
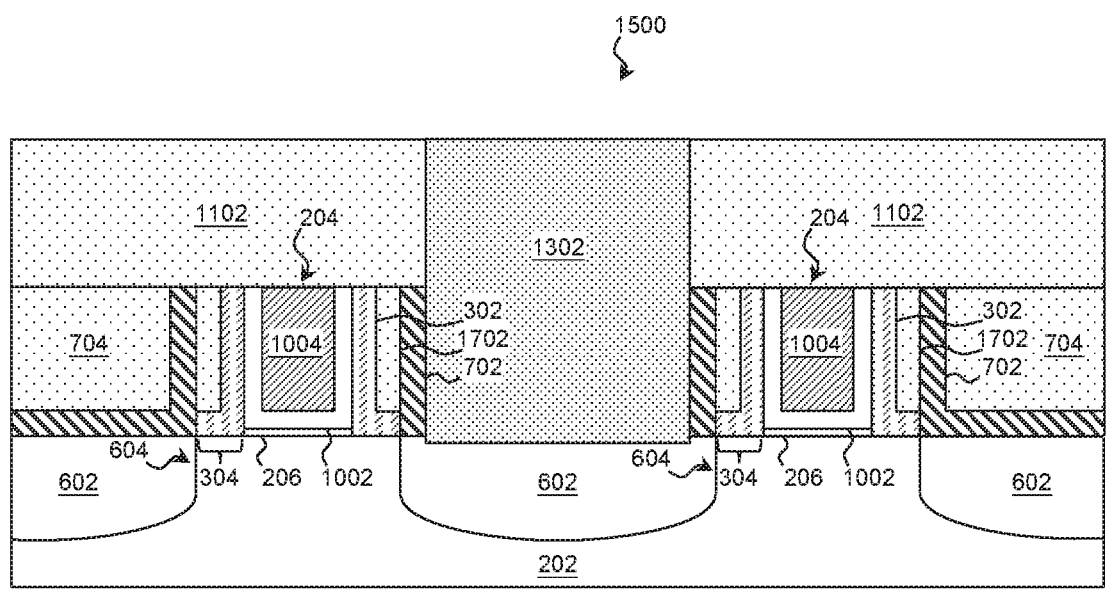
Figure 22B:
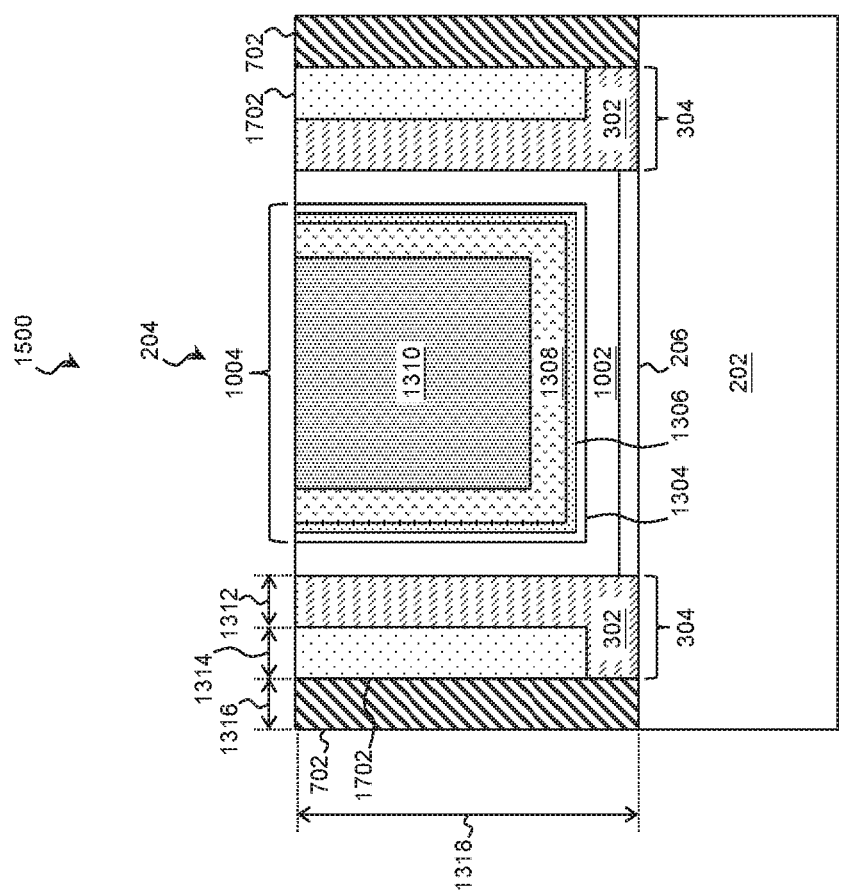

Referring now to FIG. 22B, the inner spacer layer 302, the low-k spacer layer 1702, the CESL 702, the gate stack 204, and the surrounding structures of the workpiece 200 are enlarged for greater detail. Individual elements of the replacement gate electrode 1004 are shown, and in various examples, the replacement gate electrode 1004 includes a capping layer 1304, a barrier layer 1306, one or more work function layer(s) 1308 and/or an electrode fill 1310, each substantially as described above.

As noted above, in various examples, the inner spacer layer 302 has a width 1312 between about 1 nm and about 10 nm, the low-k spacer layer 1702 has a width 1314 between about 1 nm and about 10, and the CESL 702 has a width 1316 between about 1 nm and about 10 nm. The height 1318 of the gate stack 204 disposed between these layers (and by extension the height of the inner spacer layer 302 and the CESL 702) is between about 15 nm and about 25 nm in various examples. Accordingly a ratio of height to width for the inner spacer layer 302 and CESL 702 may be between about 1.5:1 and about 25:1. As the inner spacer layer 302 may extend between the low-k spacer layer 1702 and the substrate 202, the height of the low-k spacer layer 1702 is between about 5 nm and about 25 nm for a corresponding height-to-width ratio of between 0.5:1 and about 25:1 in various examples.

Referring to block 1434 of FIG. 14B, the workpiece 1500 is provided for further fabrication.

Thus, the present disclosure provides examples of an integrated circuit with a sidewall spacer and a technique for forming an integrated circuit with such a spacer. In some examples, a method includes receiving a workpiece that includes a substrate and a gate stack disposed upon the substrate. A spacer is formed on a side surface of the gate stack that includes a spacer layer with a low-k dielectric material. A source/drain region is formed in the substrate; and a source/drain contact is formed coupled to the source/drain region such that the spacer layer of the spacer is disposed between the source/drain contact and the gate stack. In some such examples, the low-k dielectric material includes a porous low-k dielectric material. In some such examples, the forming of the spacer includes depositing a low-k dielectric material precursor and a porogen and curing the low-k dielectric material precursor to form the low-k dielectric material of the spacer layer. The curing causes the porogen to create voids in the porous low-k dielectric material. In some such examples, the received gate stack includes a placeholder gate electrode and the curing of the low-k dielectric material precursor is performed after removing the placeholder gate electrode and before forming a functional gate electrode of the gate stack. In some such examples, the curing of the low-k dielectric material precursor includes applying ultra-violet radiation to the workpiece. In some such examples, the forming of the spacer includes forming a hard mask layer directly on the side surface of the gate stack and forming the spacer layer directly on the hard mask layer. In some such examples, the low-k dielectric material includes a dielectric material and a dopant from a group consisting of an n-type dopant and a p-type dopant. In some such examples, the forming of the spacer includes depositing the dielectric material on the gate stack and in situ implanting the dopant during the depositing of the dielectric material. In some such examples, the forming of the spacer includes depositing the dielectric material on the gate stack and thereafter performing an ion implantation process upon the workpiece to implant the dopant within the dielectric material.

In further examples, a method includes receiving a substrate and a gate stack disposed on the substrate. A sidewall spacer is formed on a vertical side surface of the gate stack. The sidewall spacer includes a spacer layer that includes a low-k dielectric precursor. The low-k dielectric precursor is cured to form a low-k dielectric material of the spacer layer. The curing forms a void within the low-k dielectric material. A source/drain contact is formed adjacent the gate stack such that the sidewall spacer is disposed between the source/drain contact and the gate stack. In some such examples, the curing of the low-k dielectric precursor includes applying ultraviolet radiation to the spacer layer. In some such examples, the received gate stack includes a placeholder gate electrode. The method further includes removing the placeholder gate electrode and forming a functional gate electrode of the gate stack, and the curing of the low-k dielectric precursor is performed after the removing of the placeholder gate electrode and prior to the forming of the functional gate electrode. In some such examples, the curing of the low-k dielectric precursor removes a porogen from the spacer layer to form the void within the low-k dielectric material. In some such examples, the curing of the low-k dielectric precursor causes a porogen of the spacer layer to form the void within the low-k dielectric material, and the porogen remains within the spacer layer after the curing. In some such examples, a hard mask layer of the sidewall spacer is formed directly on the vertical side surface of the gate stack, and the spacer layer is disposed directly on the hard mask layer. In some such examples, a contact etch-stop layer is formed directly on the spacer layer, wherein the contact etch-stop layer physically contacts the source/drain contact.

In further examples, a device includes a substrate, a gate stack disposed on the substrate, a sidewall spacer disposed on a side surface of the gate stack, and a source/drain contact disposed such that the sidewall spacer is disposed between the source/drain contact and the gate stack. The sidewall spacer includes a spacer layer with a low-k dielectric material, and the low-k dielectric material includes a void therein. In some such examples, the sidewall spacer includes a hard mask layer disposed between the spacer layer and the side surface of the gate stack. In some such examples, the device includes a contact etch-stop layer disposed between the source/drain contact and the spacer layer. In some such examples, the device includes a source/drain region to which the source/drain contact is coupled, and a vertical surface of the source/drain region is aligned with a vertical surface of the sidewall spacer.

In further examples, a method includes receiving a workpiece that includes a substrate and a gate stack of a transistor disposed upon the substrate. A dielectric spacer is formed on a sidewall of the gate stack. The dielectric spacer includes a dielectric material doped with a dopant. A source/drain contact of the transistor is formed on the substrate such that the dielectric spacer is disposed between the source/drain contact and the gate stack. In some such examples, the dopant is from a group consisting of an n-type dopant and a p-type dopant. In some such examples, the dopant is from a group consisting of boron and phosphorus. In some such examples, the forming of the dielectric spacer includes depositing the dielectric material and in situ doping the dielectric material with the dopant during the depositing. In some such examples, the forming of the dielectric spacer includes depositing the dielectric material and performing an ion implantation on the dielectric material to implant the dopant. In some such examples, a dopant activation process is performed on the dielectric material and the dopant of the dielectric spacer. In some such examples, the dopant activation process is performed concurrent with a source/drain dopant activation process of a source/drain region disposed in the substrate. In some such examples, the received gate stack includes a placeholder gate electrode, and the dopant activation process is performed after removing the placeholder gate electrode and before forming a functional gate electrode of the gate stack. In some such examples, the forming of the dielectric spacer forms the dielectric spacer to include a porogen, and the dopant activation process is performed concurrent with a curing process that causes the porogen to leave a void within the dielectric spacer.

In further examples, a method includes receiving a substrate and a gate stack disposed upon the substrate. A hard mask layer of a sidewall spacer is formed on a side surface of the gate stack. A spacer layer of the sidewall spacer is formed on the hard mask layer. The spacer layer includes a dielectric material and a dopant. A source/drain region is formed in the substrate adjacent the gate stack. A source/drain contact is formed coupled to the source/drain region such that the sidewall spacer is disposed between the source/drain contact and the gate stack. In some such examples, the dopant is from a group consisting of an n-type dopant and a p-type dopant. In some such examples, the dielectric material is from a group consisting of: silicon oxide, silicon nitride, and silicon oxynitride. In some such examples, a dopant activation process is performed on the spacer layer and on the source/drain region concurrently. In some such examples, the received gate stack includes a placeholder gate electrode, and the placeholder gate electrode is removed from the gate stack. A functional gate electrode of the gate stack is formed, and a dopant activation process is performed on the spacer layer after the removing of the placeholder gate electrode and prior to the forming of the functional gate electrode. In some such examples, the forming of the spacer layer includes in situ doping of the dielectric material with the dopant during deposition of the dielectric material.

In yet further examples, the device includes a substrate, a gate stack disposed on the substrate, a sidewall spacer disposed alongside the gate stack that includes a dielectric material and a dopant, and a source/drain contact disposed alongside the sidewall spacer opposite the gate stack. In some such examples, the dopant is from a group consisting of an n-type dopant and a p-type dopant. In some such examples, the dielectric material is from a group consisting of: silicon oxide, silicon nitride, and silicon oxynitride. In some such examples, the dielectric material and the dopant are contained within a first layer of the sidewall spacer, and the sidewall spacer further includes a hard mask layer disposed between the first layer of the sidewall spacer and the gate stack. In some such examples, a first portion of the hard mask layer is disposed between the first layer and the gate stack, and a second portion of the hard mask layer is disposed between the first layer and the substrate.

The foregoing outlines features of several examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a gate stack disposed on a substrate;
    a first sidewall spacer formed of a low-k dielectric material and disposed on the gate stack, wherein the low-k dielectric material is a material having a dielectric constant of 1 to less than 3.9, wherein the low-k dielectric material includes a porous low-k dielectric material and a dopant selected from the group consisting of an n-type dopant and a p-type dopant; and
    a second sidewall spacer disposed on the gate stack and extending under the first sidewall spacer such that the first sidewall spacer is prevented from physically contacting the substrate by the second sidewall spacer.

2. The device of claim 1, wherein the dopant is the p-type dopant, the p-type dopant selected from the group consisting of B and $BF_2$.

3. The device of claim 1, wherein the dopant is the n-type dopant, the n-type dopant selected from the group consisting of P and As.

4. The device of claim 1, wherein the second sidewall spacer is disposed directly on the sidewall of the gate stack such that the second sidewall spacer is closer to the gate stack than the first sidewall spacer.

5. The device of claim 1, further comprising a contact etch stop layer disposed directly on a sidewall of the first sidewall spacer, the contact etch stop layer having a top surface facing away from the substrate and the first sidewall spacer having a top surface facing away from the substrate, wherein the top surface of the contact etch stop layer and the top surface of the first sidewall surface are planarized.

6. The device of claim 1, wherein the gate stack includes:
    a gate dielectric layer;
    a capping layer disposed on the gate dielectric layer;
    a barrier layer disposed on the capping layer;
    a work function metal layer disposed on the barrier layer; and
    a metal fill layer disposed on the work function metal layer.

7. A device comprising:
    a first gate stack disposed on a substrate;

a first sidewall spacer disposed along an edge of the first gate stack, the first sidewall spacer having an L-shaped profile that defines a recess; and a second sidewall spacer formed of a low-k dielectric material and disposed on the first sidewall spacer within the recess defined by the L-shaped profile of the first sidewall spacer, wherein the low-k dielectric material is a material having a dielectric constant of 1 to less than 3.9, wherein the low-k dielectric material includes a dielectric material and a dopant selected from the group consisting of an n-type dopant and a p-type dopant, wherein the low-k dielectric material has at least one void therein.

8. The device of claim 7, wherein the dielectric material includes a material selected from the group consisting of a semiconductor oxide, a semiconductor nitride, a semiconductor oxynitride, a semiconductor carbide, and a semiconductor oxycarbonitride.

9. The device of claim 7, further comprising a contact etch stop layer disposed along a physically contacting a sidewall of the first sidewall spacer and a sidewall of the second sidewall spacer.

10. The device of claim 9, wherein the second sidewall spacer has a first sidewall and opposing second sidewall, wherein a bottom surface of the second sidewall spacer extends from the first sidewall to the second sidewall of the second sidewall spacer, and wherein the first sidewall spacer physically contacts the entire first sidewall and bottom surface of the second sidewall spacer, and wherein the contact etch stop layer physically contacts the entire second of the second sidewall spacer.

11. The device of claim 9, wherein the first sidewall spacer has a bottom surface physically contacting the substrate and an opposing top surface such that a length of the first sidewall spacer is measured from the bottom surface of the first sidewall spacer to the top surface of the first sidewall spacer, and wherein the contact etch stop layer has a bottom surface physically contacting the substrate and an opposing top surface such that a length of the contact etch stop layer is measured from the bottom surface of the contact etch stop layer to the top surface of the contact etch stop layer, wherein the first sidewall spacer and the contact etch stop layer have the same lengths.

12. The device of claim 11, further comprising:
a second gate stack disposed on the substrate;
a third sidewall spacer formed of the low-k dielectric material and disposed on the second gate stack;

an interlayer dielectric layer disposed over the first gate stack and the second gate stack;
a source/drain feature disposed in the substrate; and
a contact extending through the interlayer dielectric layer to the source/drain feature, wherein the contact etch stop layer has a sidewall extending the entire length of the contact etch from the bottom surface of the contact etch stop layer to the top surface of the contact etch stop layer, the contact physically contacting the entire sidewall of the contact etch stop layer.

13. A device comprising:
a substrate;
a gate stack disposed on the substrate;
a first sidewall spacer disposed on a side surface of the gate stack, wherein the first sidewall spacer includes a low-k dielectric material, wherein the low-k dielectric material includes a void therein and a dopant;
a second sidewall spacer disposed between the first sidewall spacer and the substrate such that the second sidewall spacer prevents the low-k dielectric material from interface with the substrate; and
a source/drain contact disposed such that the sidewall spacer is disposed between the source/drain contact and the gate stack.

14. The device of claim 13, wherein the dopant is selected from the group consisting of B, $BF_2$, P and As.

15. The device of claim 13, further comprising a contact etch stop layer disposed between the source/drain contact and the spacer layer.

16. The device of claim 15, further comprising a source/drain region disposed on the substrate to which the source/drain contact is coupled, and wherein the contact etch stop layer interfaces with the source/drain region.

17. The device of claim 13, wherein the low-k dielectric material is a material having a dielectric constant of 1 to less than 3.9, wherein the low-k dielectric material includes a dielectric material selected from the group consisting of a semiconductor oxide, a semiconductor nitride, a semiconductor oxynitride, a semiconductor carbide, and a semiconductor oxycarbonitride.

18. The device of claim 13, wherein the second sidewall interfaces with the side surface of the gate stack, wherein the second sidewall spacer has an L-shaped profile that defines a recess, and
wherein the low-k dielectric material is disposed on the second sidewall spacer within the recess defined by the L-shaped profile of the second sidewall spacer, wherein the dopant is selected from the group consisting of an n-type dopant and a p-type dopant.

* * * * *